US 6,751,150 B2

(12) United States Patent
Marr et al.

(10) Patent No.: US 6,751,150 B2
(45) Date of Patent: Jun. 15, 2004

(54) CIRCUITS AND METHOD TO PROTECT A GATE DIELECTRIC ANTIFUSE

(75) Inventors: Kenneth W. Marr, Boise, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 10/231,756

(22) Filed: Aug. 29, 2002

(65) Prior Publication Data

US 2004/0042317 A1 Mar. 4, 2004

(51) Int. Cl.⁷ .................................. G11C 7/00

(52) U.S. Cl. .............. 365/225.7; 365/145; 257/530

(58) Field of Search ................ 365/225.7, 145; 257/530

(56) References Cited

U.S. PATENT DOCUMENTS

| | | | |
|---|---|---|---|
| 4,748,490 A | 5/1988 | Hollingsworth | 357/51 |
| 5,110,754 A | 5/1992 | Lowrey et al. | 437/52 |
| 5,194,759 A * | 3/1993 | El-Ayat et al. | 365/225.7 |
| 5,299,150 A | 3/1994 | Galbraith et al. | 365/94 |
| 5,376,566 A | 12/1994 | Gonzales | 437/35 |
| 5,379,250 A | 1/1995 | Harshfield | 365/105 |
| 5,439,835 A | 8/1995 | Gonzales | 437/35 |
| 5,646,879 A | 7/1997 | Harshfield | 365/105 |
| 5,661,045 A | 8/1997 | Manning et al. | 438/286 |
| 5,714,786 A | 2/1998 | Gonzales et al. | 257/366 |
| 5,724,282 A | 3/1998 | Loughmiller et al. | 365/96 |
| 5,741,720 A | 4/1998 | Hawley et al. | 437/60 |
| 5,742,555 A | 4/1998 | Marr et al. | 365/225.7 |
| 5,789,796 A | 8/1998 | Kang et al. | 257/530 |
| 5,811,869 A | 9/1998 | Seyyedy et al. | 257/530 |
| 5,838,620 A | 11/1998 | Zagar et al. | 365/200 |
| 5,859,543 A | 1/1999 | Kolze | 326/41 |
| 5,978,248 A | 11/1999 | Marr et al. | 365/96 |
| 5,998,274 A | 12/1999 | Akram et al. | 438/306 |
| 6,005,273 A | 12/1999 | Gonzales et al. | 257/366 |
| 6,041,008 A | 3/2000 | Marr | 365/225.7 |
| 6,088,282 A | 7/2000 | Loughmiller et al. | 365/225.7 |
| 6,090,693 A | 7/2000 | Gonzales et al. | 438/592 |
| 6,194,756 B1 | 2/2001 | Gonzales | 257/305 |
| 6,233,194 B1 | 5/2001 | Marr et al. | 365/225.7 |
| 6,252,293 B1 | 6/2001 | Seyyedy et al. | 257/530 |
| 6,252,422 B1 | 6/2001 | Patel et al. | 326/80 |
| 6,271,071 B1 | 8/2001 | Gonzales | 438/238 |
| 6,285,062 B1 | 9/2001 | Marr | 257/361 |
| 6,300,188 B1 | 10/2001 | Gonzales | 438/239 |
| 6,384,666 B1 | 5/2002 | Bertin et al. | 327/525 |
| 6,448,603 B2 | 9/2002 | Gonzales | 257/306 |

(List continued on next page.)

OTHER PUBLICATIONS

Candelier, P., et al., "One Time Programmable Drift Antifuse Cell Reliability", *IEEE International Reliability Physics Symposium Proceedings*, San Jose, Ca,(2000), pp. 169–173.

Dabral, S., et al., *Basic ESD and I/O design*, John Wiley & Sons, Inc, New York,(1998), pp. 260–263.

Dabral, Sanjay, et al., *Basic ESD and I/O Design*, (1998), pp. 272.

(List continued on next page.)

*Primary Examiner*—Tan T. Nguyen
(74) *Attorney, Agent, or Firm*—Schwegman, Lundberg, Woessner & Kluth, P.A.

(57) ABSTRACT

According to embodiments of the present invention, an antifuse circuit is operated by coupling an elevated voltage to a first terminal of an antifuse, controlling current in the antifuse with a program driver circuit coupled to a second terminal of the antifuse, and shunting current around the antifuse with a bypass circuit coupled between the first terminal of the antifuse and the program driver circuit to protect the antifuse. The antifuse includes a layer of gate dielectric between the first terminal and the second terminal. The embodiments of the present invention protect a gate dielectric antifuse.

50 Claims, 17 Drawing Sheets

U.S. PATENT DOCUMENTS

| | | | |
|---|---|---|---|
| 6,456,149 B2 | 9/2002 | Cutter et al. | 327/525 |
| 6,515,931 B2 | 2/2003 | Marr et al. | 365/225.7 |
| 6,545,928 B1 * | 4/2003 | Bell | 365/225.7 |
| 6,570,805 B2 | 5/2003 | McCollum | 365/225.7 |
| 6,630,724 B1 * | 10/2003 | Marr | 257/530 |
| 2001/0051407 A1 | 12/2001 | Tran | 438/241 |
| 2001/0054740 A1 | 12/2001 | Marr | 257/360 |

OTHER PUBLICATIONS

De Graaf, C., et al., "A Novel High–Density Low–Cost Diode Programmable Read Only Memory", *IEDM Technical Digest*, San Francisco, Ca,(1996),pp. 189–192.

Dobberpuhl, D.W., et al., "A 200–MHz 64–b Dual–Issue CMOS Microprocessor", *IEEE Journal of Solid–State Circuits, 27(11)*, (1992),pp. 1555–1567.

Hamdy, E., et al., "Dielectric based antifuse for logic and memory ICs", *IEDM*, San Francisco, Ca,(1998),pp. 786–789.

Hower, P. L. et al., "Snapback and Safe Operating Area of ldmos Transistors", *IEDM*, (1999),pp. 193–196.

Kalnitsky, A., et al., "CoSi2 integrated fuses on poly silicon for low voltage 0.18 micrometer CMOS applications", *IEDM*, (1999), pp. 765–768.

Lee, H., et al., "THPM 13.4: An Experimental 1 Mb CMOS SRAM with Configurable Organization and Operation", *IEEE International Solid–State Circuits Conference*, (1998), pp. 180–181, 359.

Ludikhuize, A. W., et al., "Analysis of hot–carrier–induced degradation and snapback in submicron 50V lateral MOS transistors", *IEEE*, (1997),pp. 53–56.

Schroder, H U., et al., "High Voltage resistant ESD protection circuitry of 0.5um CMOS OTP/EPROM programming pin", *EOS/ESD Symposium*, (1998),pp. 2A.6.1–2A.6.8.

Voldman, S. H., "ESD Protection in a Mixed Voltage Interface and Multi–Rail Diconnected Power Grid Environment in 0.50–and 0.25–micrometer Channel Length CMOS Technologies", *EOS/ESD Symposium*, (1994),pp. 125–134.

* cited by examiner

CIRCUITS AND METHOD TO PROTECT A GATE DIELECTRIC ANTIFUSE

FIELD OF THE INVENTION

The present invention relates generally to integrated circuits, and more particularly, to circuits and methods to protect a gate dielectric antifuse.

BACKGROUND

Integrated circuits are interconnected networks of electrical components fabricated on a common foundation called a substrate. The electrical components are typically fabricated on a wafer of semiconductor material that serves as a substrate. Various fabrication techniques, such as layering, doping, masking, and etching, are used to build millions of resistors, transistors, and other electrical components on the wafer. The components are then wired together, or interconnected, to define a specific electrical circuit, such as a processor or a memory device.

Fusible elements are employed in integrated circuits to permit changes in the configuration of the integrated circuits after fabrication. For example, fusible elements may be used to replace defective circuits with redundant circuits. Memory devices are typically fabricated with redundant memory cells. The redundant memory cells may be enabled with fusible elements after fabrication to replace defective memory cells found during a test of fabricated memory devices. Fusible elements are also used to customize the configuration of a generic integrated circuit after it is fabricated, or to identify an integrated circuit.

One type of fusible element is a polysilicon fuse. The polysilicon fuse comprises a polysilicon conductor fabricated to conduct electrical current on an integrated circuit. A portion of the polysilicon fuse may be evaporated or opened by a laser beam to create an open circuit between terminals of the polysilicon fuse. The laser beam may be used to open selected polysilicon fuses in an integrated circuit to change its configuration. The use of polysilicon fuses is attended by several disadvantages. Polysilicon fuses must be spaced apart from each other in an integrated circuit such that when one of them is being opened by a laser beam the other polysilicon fuses are not damaged. A bank of polysilicon fuses therefore occupies a substantial area of an integrated circuit. In addition, polysilicon fuses cannot be opened once an integrated circuit is placed in an integrated circuit package, or is encapsulated in any manner.

Another type of fusible element is an antifuse. An antifuse comprises two conductive terminals separated by an insulator or a dielectric, and is fabricated as an open circuit. The antifuse is programmed by applying a high voltage across its terminals to rupture the insulator and form an electrical path between the terminals.

Antifuses have several advantages that are not available with fuses. A bank of antifuses takes up much less area of an integrated circuit because they are programmed by a voltage difference that can be supplied on wires connected to the terminals of each of the antifuses. The antifuses may be placed close together in the bank, and adjacent antifuses are not at risk when one is being programmed. Antifuses may also be programmed after an integrated circuit is placed in an integrated circuit package, or encapsulated, by applying appropriate signals to pins of the package. This is a significant advantage for several reasons. First, an integrated circuit may be tested after it is in a package, and may then be repaired by replacing defective circuits with redundant circuits by programming selected antifuses. A generic integrated circuit may be tested and placed in a package before it is configured to meet the specifications of a customer. This reduces the delay between a customer order and shipment. The use of antifuses to customize generic integrated circuits also improves the production yield for integrated circuits because the same generic integrated circuit may be produced to meet the needs of a wide variety of customers.

Despite their advantages, the use of antifuses in integrated circuits is limited by a lack of adequate circuitry to support the programming and reading of the antifuses. There exists a need for improved circuits and methods for programming and reading antifuses in integrated circuits.

SUMMARY OF THE INVENTION

The above mentioned and other deficiencies are addressed in the following detailed description. According to embodiments of the present invention, an antifuse circuit is operated by coupling an elevated voltage to a first terminal of an antifuse, controlling current in the antifuse with a program driver circuit coupled to a second terminal of the antifuse, and shunting current around the antifuse with a bypass circuit coupled between the first terminal of the antifuse and the program driver circuit to protect the antifuse. The antifuse includes a layer of gate dielectric between the first terminal and the second terminal.

The embodiments of the present invention protect a gate dielectric antifuse, and facilitate all the advantages associated with the use of antifuses in integrated circuits.

DETAILED DESCRIPTION

Figure 1:
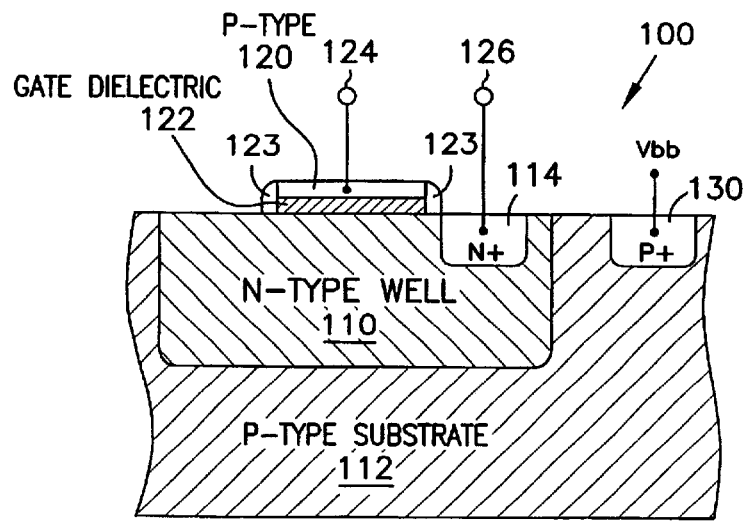
FIG. 1 is a cross-sectional view of an antifuse according to an embodiment of the present invention.

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

The terms wafer and substrate may be used in the following description and include any structure having an exposed surface with which to form an integrated circuit (IC) according to embodiments of the present invention. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art.

The term "horizontal" is defined as a plane substantially parallel to the conventional plane or surface of a wafer or substrate, regardless of the orientation of the wafer or substrate. The term "vertical" refers to a direction substantially perpendicular to the horizonal as defined above. Prepositions, such as "on," "upper," "side" (as in "sidewall"), "higher," "lower," "over," and "under" are defined with respect to the conventional plane or surface being on the top surface of the wafer or substrate, regardless of the orientation of the wafer or substrate. The prepositions "on," "upper,""side," "higher," "lower," "over," and "under" are thereby defined with respect to "horizontal" and "vertical."

Antifuses and transistors described herein according to embodiments of the present invention may have wells that may be formed in other wells or tanks rather than substrates. Such wells or tanks may be situated with other wells or tanks, or within other wells or tanks, in a larger substrate. The wells or tanks may also be situated in a silicon-on-insulator (SOI) device.

The term "source/drain" refers generally to the terminals or diffusion regions of a field effect transistor. A terminal or a diffusion region may be more specifically described as a "source" or a "drain" on the basis of a voltage applied to it when the field effect transistor is in operation.

P-type conductivity is conductivity associated with holes in a semiconductor material, and n-type conductivity is conductivity associated with electrons in a semiconductor material. Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n and p-type semiconductor materials, respectively.

In this description a transistor is described as being activated or switched on when it is rendered conductive by a control gate voltage that is separated from its source voltage by at least its threshold voltage. The transistor is described as being in an inactive state or switched off when the control gate voltage is separated from its source voltage by less than the threshold voltage and the transistor is rendered non-conductive. A digital signal of 1 may be called a high signal and a digital signal of 0 may be called a low signal. Embodiments of the present invention described herein may be coupled to receive a power supply voltage Vcc which is within approximately 1 to 5 volts. By way of example in this description, and not by way of limitation, Vcc is approximately 3 volts. Embodiments of the present invention described herein may be coupled to receive a ground voltage reference Vss, and a bulk node voltage Vbb. The voltage Vbb may be approximately equal to Vss, or may be slightly less than Vss such as approximately minus 1 to minus 2 volts. Vbb is often coupled to p-type wells and p-type substrates in integrated circuits described herein. Vcc, Vss, and Vbb are received directly or are generated by circuits that are not shown for purposes of brevity, but are known to those skilled in the art.

A cross-sectional view of an antifuse 100 according to an embodiment of the present invention is shown in FIG. 1. An n-type well 110 is formed in a p-type substrate 112, and an n+-type diffusion region 114 is formed in the well 110. The n+type diffusion region 114 provides an ohmic contact for the well 110. A p-type gate electrode 120 is formed over a layer of gate dielectric 122 which is formed over the well 110. One or more spacers 123 are formed on the sides of the gate dielectric 122 and the gate electrode 120. The gate electrode 120 is connected to a first terminal 124 of the antifuse 100, and a second terminal 126 is connected to the n+-type diffusion region 114. In alternate embodiments of the present invention the gate electrode 120 comprises polysilicon or layers of polysilicon and a silicide such as tungsten silicide ($WSi_x$), titanium silicide ($TiSi_2$), or cobalt silicide ($CoSi_2$). The gate dielectric 122 may be oxide, oxynitride, or nitrided oxide. A p+-type diffusion region 130 is formed in the substrate 112 to provide an ohmic contact coupling the substrate 112 to Vbb.

Two separate circuits in an integrated circuit may be connected respectively to the first and second terminals 124, 126 of the antifuse 100. The antifuse 100 is an open circuit between the terminals until it is programmed in the following manner. The p-type substrate 112 is coupled to Vbb and the first terminal 124 attached to the p-type gate electrode 120 is coupled to a positive elevated voltage, such as approximately 7–8 volts. The second terminal 126 is coupled to bring the well 110 to a low voltage. A voltage drop between the well 110 and the p-type gate electrode 120 is enough to rupture the gate dielectric 122. When programmed the antifuse 100 has a conductive connection between the first and second terminals 124,126 which may be biased appropriately such that the p-n junction between the p-type gate electrode 120 and the well 110 allows current to flow. The programmed antifuse 100 is an impedance element between the circuits.

The gate dielectric 122 may be fabricated to be thinner than gate dielectrics in conventional field effect transistors to reduce the voltage drop necessary to rupture the gate dielectric 122. The antifuse 100 with a thinner gate dielectric 122 would be programmable with a lower elevated voltage, and thus reduce the effects of the elevated voltage on neighboring circuits. The antifuse 100 may be formed in a semiconductor layer formed over an insulator according to alternate embodiments of the present invention.

The antifuse 100 described above may be used for a variety of purposes in an integrated circuit. For example, the antifuse 100 may be programmed to provide a coupling to redundant circuits, to change a configuration of the integrated circuit, to tie a line to a voltage or to Vss, to change the timing of the integrated circuit, or to provide identification for the integrated circuit. The integrated circuit may be a memory device, a processor, or any other type of integrated circuit device by way of example and not by way of limitation. One or more registers of the antifuse 100 may be programmed to comprise an electrically programmable read-only memory (EPROM).

A large number of antifuses such as the antifuse 100 described above are arranged in banks of antifuses in an integrated circuit. A single antifuse bank 200 in an integrated circuit is shown in a block diagram in FIG. 2 according to an embodiment of the present invention. An antifuse 210 has a first terminal coupled to an external pin 220 through a common bus line 230, and a second terminal coupled to a program driver circuit 242. The antifuse 210 has the structure and operational method of the antifuse 100 described above, and is represented by a triangle inscribed with the letter A. The program driver circuit 242 is used to select the antifuse 210 to be programmed during a programming mode of operation. A read circuit 244 is coupled to the antifuse 210 through the program driver circuit 242 to read a state of the antifuse 210 during an active mode of operation. A gate bias circuit 254 is coupled between the external pin 220 through the common bus line 230 and the program driver circuit 242.

The antifuse 210, the program driver circuit 242, and the read circuit 244 comprise a single antifuse module 260 in the antifuse bank 200. Other antifuse modules 262 and 264 each include a single antifuse coupled to a program driver circuit and a read circuit similar to those elements in the antifuse module 260. The gate bias circuit 254 is coupled between the common bus line 230 and the program driver circuits in each of the antifuse modules 260, 262, and 264 according to the embodiment of the present invention. The antifuse bank 200 includes other antifuse modules similar to the antifuse module 260 which are not shown for purposes of brevity. The antifuse bank 200 may include hundreds or thousands of antifuse modules (not shown) similar to the antifuse module 260, each antifuse module being coupled to the gate bias circuit 254 which is a global circuit in the antifuse bank 200. A bypass circuit 270 is coupled in parallel with the antifuse 210 between the common bus line 230 and the program driver circuit 242 in each of the antifuse modules 260, 262, and 264 according to an embodiment of the present invention. In other embodiments of the present invention a pre-charge circuit 272 is coupled between the common bus line 230 and the program driver circuit 242 in each of the antifuse modules 260, 262, and 264. All of the other antifuse modules (not shown) in the antifuse bank 200 are coupled to the pre-charge circuit 272 which is a global circuit in the antifuse bank 200. The bypass circuit 270 and the pre-charge circuit 272 are used to protect the antifuse 210 in alternate embodiments of the present invention as will be described hereinbelow.

During the programming mode, an elevated voltage is applied to the external pin 220 and the common bus line 230 that exceeds Vcc of the integrated circuit by a substantial amount. The elevated voltage provides the potential necessary to rupture the gate dielectrics of antifuses selected to be programmed. The elevated voltage is removed from the external pin 220 during the active mode and during a sleep mode of operation and the integrated circuit operates from Vcc. During the active mode and the sleep mode, the external pin 220 may be coupled to Vcc or to a different read voltage. The use of the external pin 220 to couple the elevated voltage to the antifuse 210 during the programming mode substantially protects other portions of the integrated circuit from damage that may be caused by the elevated voltage.

The gate bias circuit 254 is coupled to program driver circuits for each of the other antifuse modules in the antifuse bank 200 to bias a gate of a transistor in each program driver circuit as will be described hereinbelow. The integrated circuit includes many antifuse banks similar to the antifuse bank 200 according to alternate embodiments of the present invention.

Figure 3:
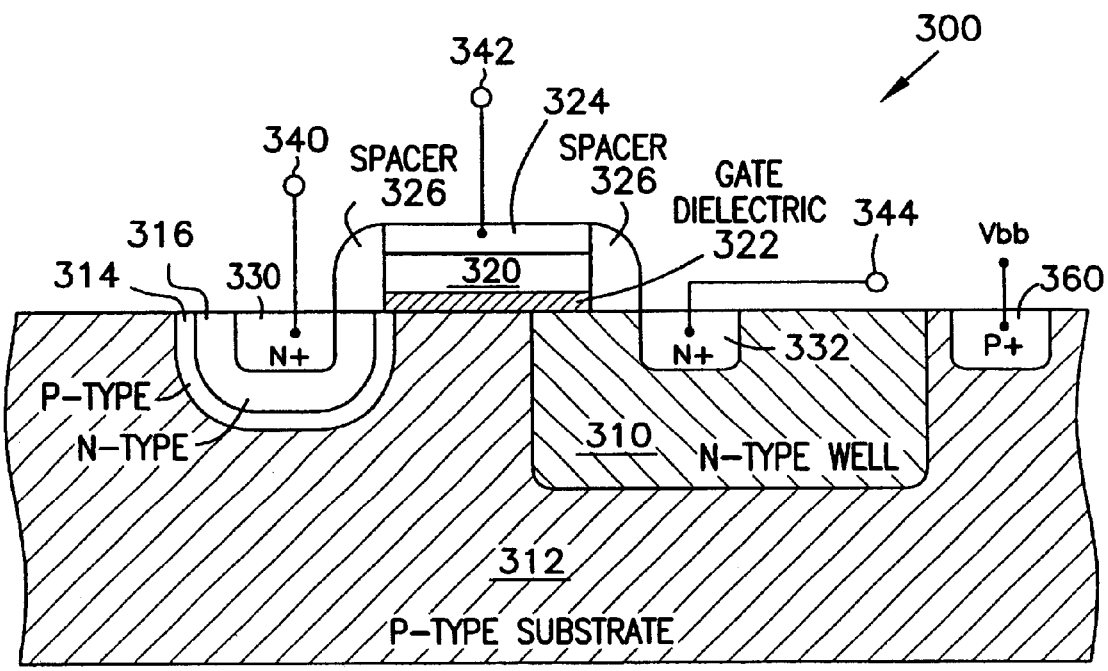
FIG. 3 is a cross-sectional view of a high-voltage transistor according to an embodiment of the present invention.

The gate bias circuit 254 and the program driver circuit 242 each include at least one high-voltage transistor (HVT). One example of such a HVT is an n-well drain transistor 300, a cross-sectional view of which is shown in FIG. 3 according to an embodiment of the present invention. An n-type well 310 is formed in a drain side of a p-type substrate 312, and a p-type halo implant 314 is formed in a source side of the substrate 312. An n-type lightly doped drain (LDD) 316 is implanted inside the halo implant 314. A gate 320 is formed over a layer of gate dielectric 322 which is formed over the substrate 312 between the n-type well 310 and the halo implant 314. An electrode 324 is formed over the gate 320. In alternate embodiments of the present invention the gate 320 may comprise polysilicon and the electrode 324 may comprise a silicide such as tungsten silicide ($WSi_x$), titanium silicide ($TiSi_2$), or cobalt silicide ($CoSi_2$). The gate dielectric 322 may be oxide, oxynitride, or nitrided oxide. The gate 320 and the electrode 324 may also comprise metal. One or more spacers 326 are then formed on the sides of the gate dielectric 322, the gate 320, and the electrode 324. An n+-type source diffusion region 330 is implanted inside the LDD 316 and the halo implant 314. Also, an n+-type drain diffusion region 332 is implanted in the n-type well 310. The drain diffusion region 332 is not surrounded by LDD or halo implants which are blocked from the drain side of the substrate 312. A source terminal 340 is connected to the source diffusion region 330, a gate terminal 342 is connected to the electrode 324, and a drain terminal 344 is connected to the drain diffusion region 332. A p+-type diffusion region 360 is formed in the substrate 312 to provide an ohmic contact coupling the substrate 312 to Vbb.

The n-well drain transistor 300 has a high drain breakdown voltage. In operation the substrate 312 is coupled to Vbb and the drain terminal 344 is coupled to a line with a high positive voltage, such as the common bus line 230 shown in FIG. 2 during the programming mode. The n-well drain transistor 300 will break down and allow current to flow between the drain terminal 344 and the substrate 312 when a critical electric field intensity (E) is reached across a boundary between the n-type well 310 and the p-type substrate 312. E may be approximated as the voltage drop across the boundary divided by a width of a depletion region at the boundary of the n-type well 310 and the p-type substrate 312. Dopant concentrations in the n-type well 310 and the p-type substrate 312 are relatively low such that the width of the depletion region between the two is relatively large. The boundary will not break down even under a very large voltage drop across the boundary because the E is less than the critical E. As a result, the n-well drain transistor 300 will not break down even if the voltage on the drain terminal 344 is relatively high. In contrast, an ordinary n-channel transistor does not have the n-type well 310, and there is a boundary between a p-type substrate and an n+-type drain diffusion region with a very high dopant concentration. A depletion region at this boundary is not very wide, and as a consequence it will break down under a smaller voltage.

Figure 4:
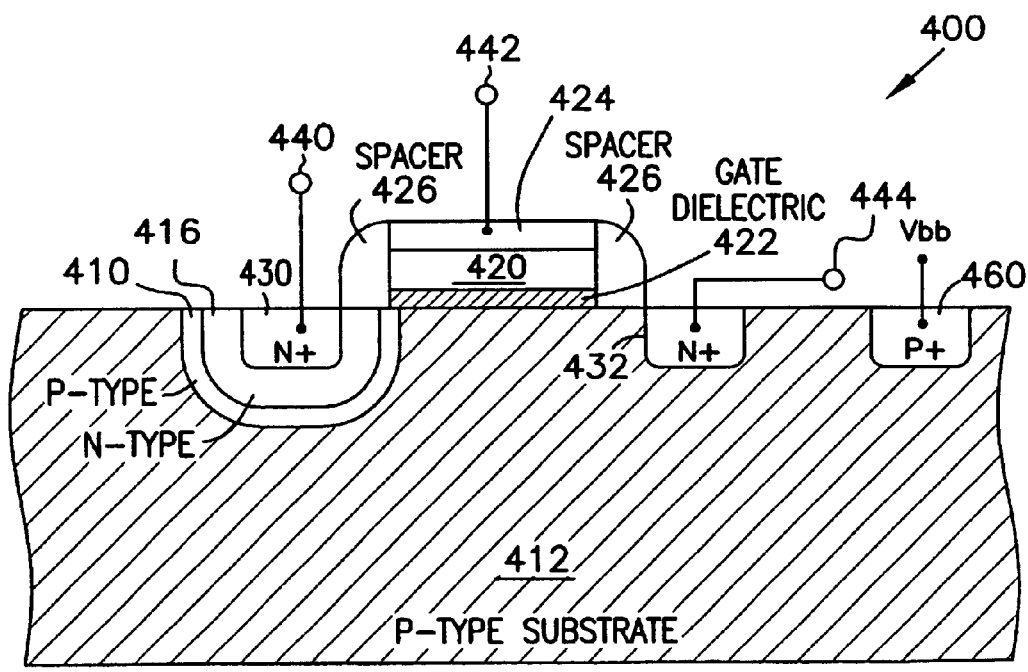
FIG. 4 is a cross-sectional view of a high-voltage transistor according to an embodiment of the present invention.

A cross-sectional view of an n-channel transistor 400 is shown in FIG. 4 according to an embodiment of the present invention. The transistor 400 is a HVT. A gate 420 is formed over a layer of gate dielectric 422 which is formed over a p-type substrate 412. An electrode 424 is formed over the gate 420. A p-type halo implant 410 is formed in a source side of the substrate 412. An n-type lightly doped drain (LDD) 416 is implanted inside the halo implant 410. In alternate embodiments of the present invention the gate 420 comprises polysilicon and the electrode 424 may comprise a silicide such as tungsten silicide (WSi$_x$), titanium silicide (TiSi$_2$), or cobalt silicide (CoSi$_2$). The gate 420 and the electrode 424 may comprise metal. The gate dielectric 422 may be oxide, oxynitride, or nitrided oxide. One or more spacers 426 are then formed on the sides of the gate dielectric 422, the gate 420, and the electrode 424. An n+-type source diffusion region 430 is implanted inside the LDD 416 and the halo implant 410. Also, an n+-type drain diffusion region 432 is implanted in the substrate 412. The drain diffusion region 432 is not surrounded by LDD or halo implants which are blocked from a drain side of the substrate 412. A source terminal 440 is connected to the source diffusion region 430, a gate terminal 442 is connected to the electrode 424, and a drain terminal 444 is connected to the drain diffusion region 432. The drain diffusion region 432 and the source diffusion region 430 are self-aligned with the spacers 426. A p+-type diffusion region 460 is formed in the substrate 412 to provide an ohmic contact coupling the substrate 412 to Vbb. In another embodiment of the present invention, an added mask and implant could be applied to the drain diffusion region 432 to customize the high drain breakdown voltage of the n-channel transistor 400. The n-channel transistor 400 has a high drain breakdown voltage and may be used in embodiments of the present invention described above in place of the n-well drain transistor 300.shown in FIG. 3.

The transistors 300 and 400 shown in FIGS. 3 and 4 may be fabricated according to process steps used to fabricate field-effect transistors in an integrated circuit, and do not require extra process steps.

Figure 2:
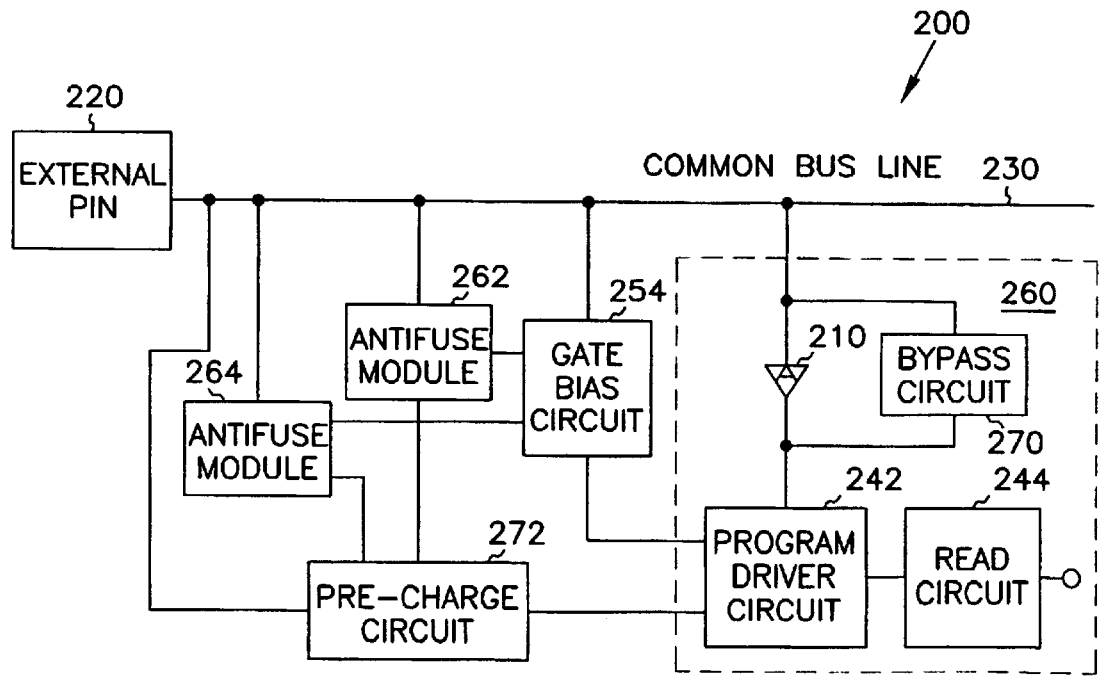
FIG. 2 is a block diagram of support circuits for antifuses according to an embodiment of the present invention.
Figure 5A:
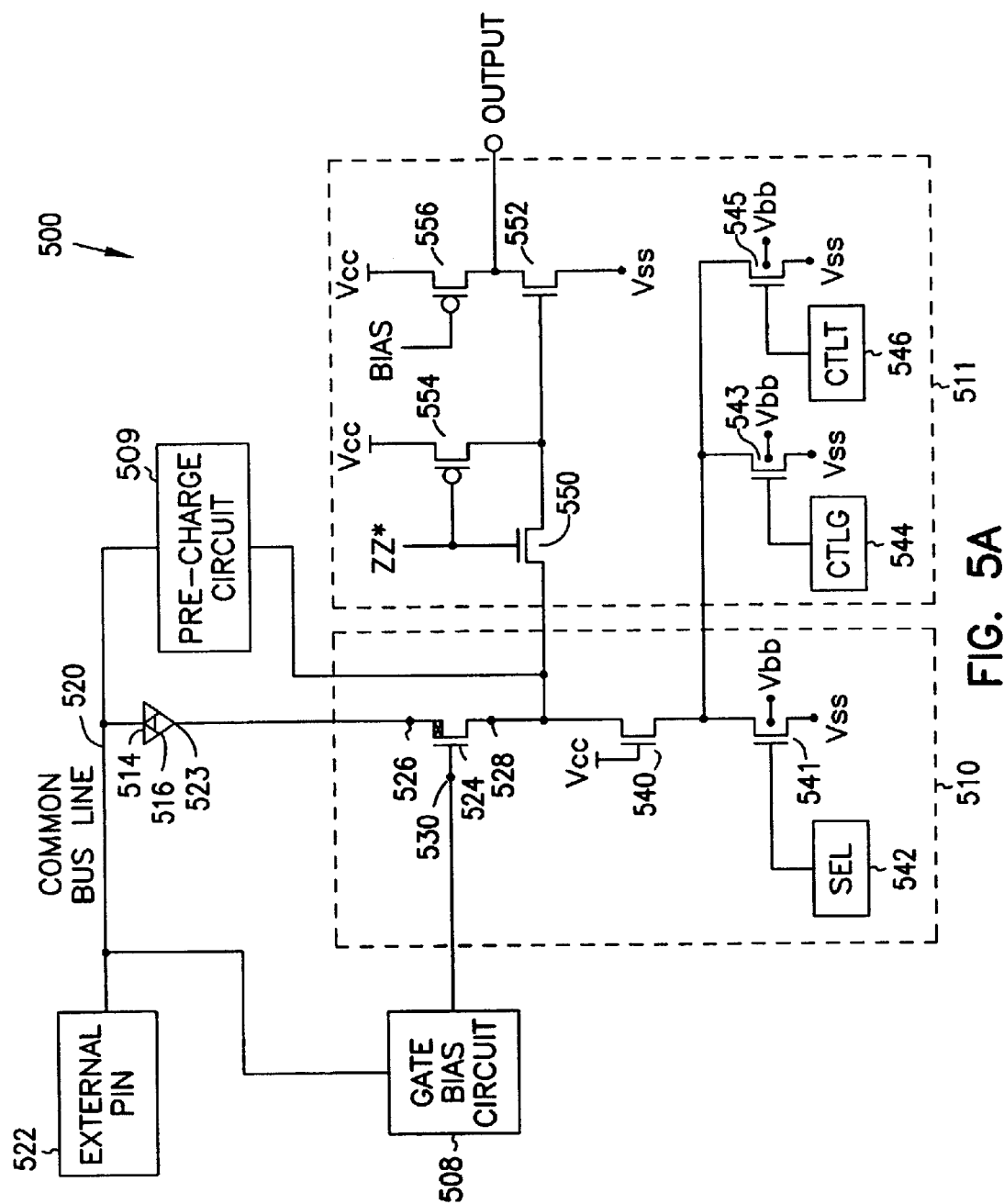
FIG. 5A is an electrical schematic diagram of support circuits for antifuses according to an embodiment of the present invention.

Several of the circuits in the antifuse bank 200 shown in FIG. 2 are shown in greater detail in FIG. 5A. An electrical schematic diagram of several support circuits 500 for programming and reading antifuses is shown in FIG. 5A according to an embodiment of the present invention. The circuits 500 include a gate bias circuit 508, a pre-charge circuit 509, a program driver circuit 510, and a read circuit 511. A gate electrode 514 of an antifuse 516 is coupled through a common bus line 520 to an external pin 522, and the program driver circuit 510 is coupled to a well 523 of the antifuse 516. The antifuse 516 is similar in structure and operation to the antifuse 100 shown in FIG. 1. The gate bias circuit 508 is coupled to other program driver circuits (not shown) in the antifuse bank 200.

The gate electrode 514 or the well 523 of the antifuse 516 may be coupled to the common bus line 520, with the other end of the antifuse 516 being coupled to the program driver circuit 510 according to alternate embodiments of the present invention. The antifuse 516 may be coupled to the common bus line 520 such that, if it has a p/n junction of p-type material and n-type material after being programmed, the p/n junction will be forward biased during the active mode of operation to present a low impedance to current flow.

The program driver circuit 510 includes a HVT 524 having a drain terminal 526, a source terminal 528, and a gate terminal 530. The HVT 524 is similar in structure and operating characteristics to the n-channel transistor 400 shown in FIG. 4. The drain terminal 526 is coupled to the well 523 of the antifuse 516. The gate terminal 530 is coupled to the gate bias circuit 508, and the gate bias circuit 508 is coupled to the common bus line 520 and the external pin 522. Current will flow through the HVT 524 as long as the other elements of the circuits 500 allow current to flow, as will be described hereinbelow. The gate bias circuit 508 couples the gate terminal 530 to a selected voltage as will be described hereinbelow. The pre-charge circuit 509 is coupled between the common bus line 520 and the source terminal 528 of the HVT 524 to provide current to protect the antifuse 516 as will be described hereinbelow.

The program driver circuit 510 also includes a first n-channel transistor 540 and a second n-channel transistor 541 coupled in cascode between the source terminal 528 and Vss. A gate terminal of the transistor 540 is coupled to Vcc, and the transistor 540 is switched on as long as Vcc exceeds a voltage at its source terminal by a threshold voltage $V_T$ of the transistor 540. A gate terminal of the transistor 541 is coupled to a select logic circuit SEL 542 that controls the program driver circuit 510 during the programming, active, and sleep modes. A body terminal of the transistor 541 is coupled to Vbb. The transistor 541 is switched off by the logic circuit SEL 542 in each of the programming, active, and sleep modes, and is switched on for a short period to program the antifuse 516 during the programming mode.

An n-channel transistor 543 is coupled in parallel with the transistor 541 between the transistor 540 and Vss. A gate terminal of the transistor 543 is coupled to a control logic circuit CTLG 544 that controls current through the transistor 543. The transistor 543 is a long-L transistor that may conduct between approximately 0.06 and 1 microamps, and is switched on by the control logic circuit CTLG 544 during the active mode as will be described hereinbelow.

An n-channel transistor 545 is coupled in parallel with the transistors 541 and 543 between the transistor 540 and Vss. A gate terminal of the transistor 545 is coupled to a control logic circuit CTLT 546 that controls current through the transistor 545. The transistor 545 is a short-L transistor that may conduct between approximately 1–28 microamps, and is switched on by the control logic circuit CTLT 546 during the active mode as will be described hereinbelow.

The common bus line 520 is coupled to receive an elevated voltage during the programming mode, for example approximately 7–8 volts, through the external pin 522. Before the antifuse 516 is programmed the elevated voltage on the common bus line 520 is distributed across the antifuse 516, and the transistors 524, 540, 541, 543, and 545 which are non-linear elements. Each of the antifuse 516 and the transistors 524, 540, 541, 543, and 545 in the program driver circuit 510 bears a portion of the elevated voltage in a manner similar to a capacitor divider circuit. The distribution of the elevated voltage is non-linear and may vary over time. When the antifuse 516 is programmed, it is an impedance element and the distribution of the elevated voltage changes. Voltages along the program driver circuit 510 rise as the antifuse 516 is programmed, and the elevated voltage is distributed across the antifuse 516 and the transistors 524, 540, 541, 543, and 545 in a manner similar to a resistor divider circuit. Each of the antifuse 516 and the transistors 524, 540, 541, 543, and 545 bears a portion of the elevated voltage.

Figure 6:
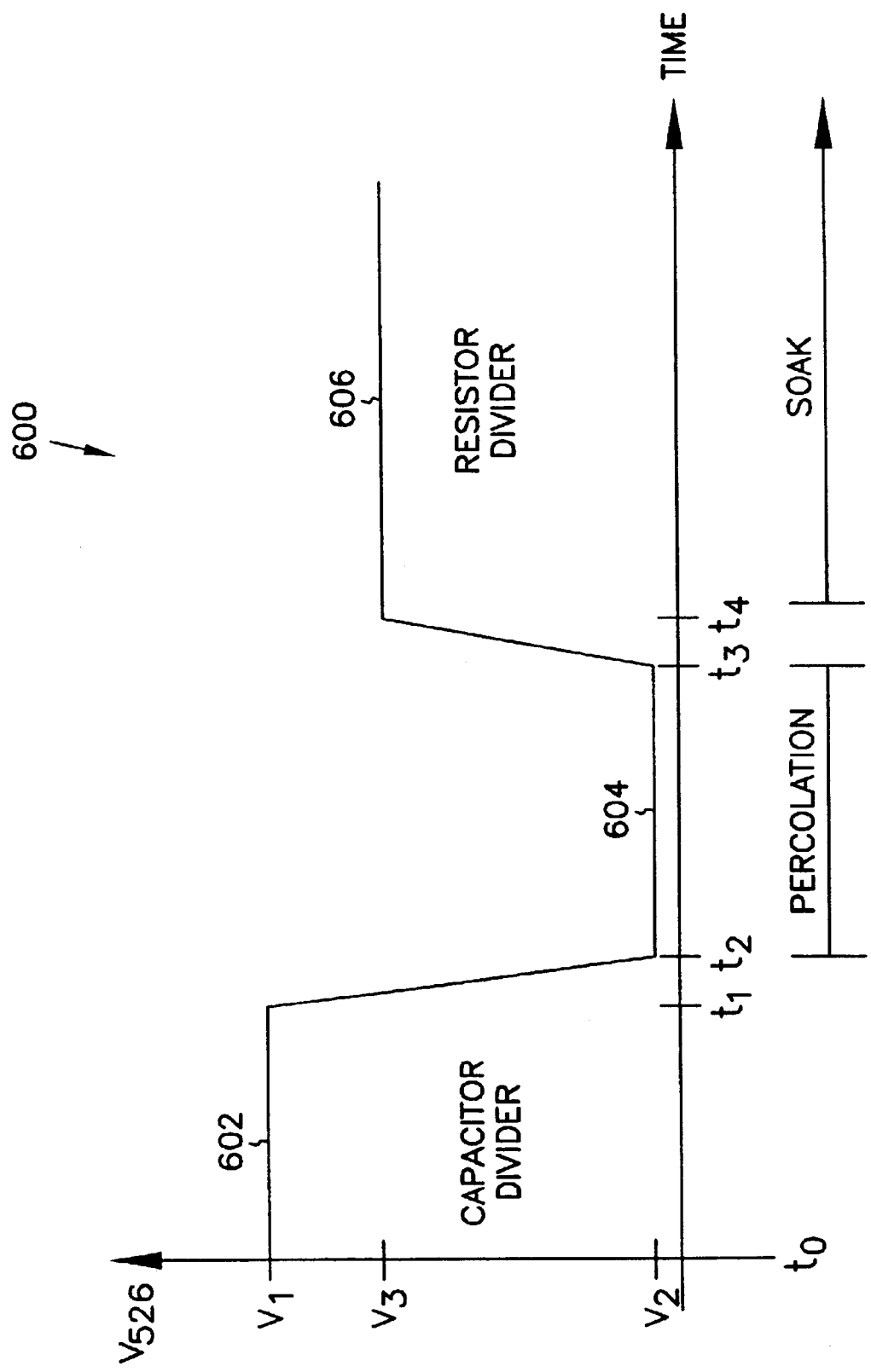
FIG. 6 is a timing diagram for programming an antifuse according to an embodiment of the present invention.

The antifuse 516 may be selected to be programmed by the logic circuit SEL 542 by switching on the transistor 541 to conduct current from the common bus line 520 through to Vss. The transistor 541 is switched on for a short period of time to allow the elevated voltage on the common bus line 520 to rupture a gate dielectric in the antifuse 516, and is then switched off. A timing diagram 600 of a voltage $V_{526}$ at the drain terminal 526 of the HVT 524 during the programming of the antifuse 516 is shown in FIG. 6 according to an embodiment of the present invention. The voltage $V_{526}$ is shown on a vertical axis and time is shown on a horizontal axis. Starting at a time to the voltage $V_{526}$ is high at $V_1$ and the program driver circuit 510 behaves as a capacitor divider circuit during a period 602 until a time $t_1$ when the transistor 541 is switched on. The voltage $V_{526}$ then falls quickly to a low voltage $V_2$ that is near Vss. The antifuse 516 undergoes a percolation period 604 between times $t_2$ and $t_3$ while the antifuse 516 remains intact under a significant voltage drop between the elevated voltage and $V_2$. The percolation period may last approximately from ½ to 1 microsecond. The gate dielectric in the antifuse 516 ruptures between times $t_3$ and $t_4$ and the voltage $V_{526}$ rises to $V_3$ after time $t_4$. The antifuse 516 is an impedance element after time $t_4$ and the program driver circuit 510 bears the elevated voltage in a manner similar to a resistor divider circuit. The transistor 541 remains switched on after time $t_4$ during a soak period 606 of approximately 10 milliseconds to permit a delivered energy to thoroughly rupture the gate dielectric in the antifuse 516. The energy delivered to the gate dielectric is approximately equal to the current through the antifuse 516 during the soak period 606 multiplied by the voltage drop across the antifuse 516 and divided by the time of the soak period 606. The voltage $V_{526}$ remains at $V_3$ during the soak period 606 while the transistor 541 is switched on.

The read circuit 511 includes elements used to read a state of the antifuse 516, and these elements will now be described according to an embodiment of the present invention. The read circuit 511 also includes the transistor 543, the control logic circuit CTLG 544, the transistor 545, and the control logic circuit CTLT 546. The program driver circuit 510 is also coupled to the read circuit 511 through an n-channel pass-gate transistor 550. A drain of the pass-gate transistor 550 is coupled to the source terminal 528 of the HVT 524, and a source of the pass-gate transistor 550 is coupled to a gate of an n-channel transistor 552. A sleep signal ZZ* is coupled to a gate of the pass-gate transistor 550 and to a gate of a p-channel transistor 554. The sleep signal ZZ* is an active-low signal that is high during the active mode to switch on the pass-gate transistor 550 and low during the sleep mode to switch off the pass-gate transistor 550. The transistor 554 has a source coupled to Vcc and a drain coupled to the source of the passgate transistor 550 and the gate of the transistor 552. The transistor 552 has a source coupled to Vss and a drain coupled to a drain of a p-channel transistor 556. A source of the transistor 556 is coupled to Vcc. A gate of the transistor 556 is coupled to a bias signal BIAS, which configures the transistor 556 as a bandgap-based current source. The drains of the transistors 552 and 556 generate an output signal OUTPUT at an output indicating the state of the antifuse 516 during the active mode.

During the active and sleep modes of operation, the common bus line 520 and the external pin 522 are coupled to a read voltage VREAD according to an embodiment of the present invention. The read voltage VREAD may be more or less or approximately equal to Vcc. The read voltage VREAD is supplied from a source external to the circuits 500 through the external pin 522, and this is called supply stealing.

The elevated voltage and the read voltage VREAD are coupled to the common bus line 230 or the common bus line 520 from a driver circuit instead of the external pins 220 or 522 according to alternate embodiments of the present invention. The driver circuit is located in the antifuse bank 200 or the circuits 500. The entire disclosure of U.S. application Ser. No. 09/652,429 entitled GATE DIELECTRIC ANTIFUSE CIRCUITS AND METHODS FOR OPERATING SAME and filed on Aug. 31,2000, is incorporated herein by reference. The application Ser. No. 09/652,429 discloses a driver circuit and other circuits that are used with and coupled to the circuits described herein according to alternate embodiments of the present invention.

The read circuit 511 generates the output signal OUTPUT in the following manner. The pass-gate transistor 550 is switched off and the transistor 554 is switched on during the sleep mode by the sleep signal ZZ*. The gate of the transistor 552 is coupled through the transistor 554 to Vcc to switch on the transistor 552 to generate a low OUTPUT signal at the drain of the transistor 552.

The pass-gate transistor 550 is switched on and the transistor 554 is switched off during the active mode by the sleep signal ZZ*. One of the transistors 543 and 545 is also switched on during the active mode by the control logic circuit CTLG 544 or CTLT 546 to draw current through the transistor 540, which is always switched on, to Vss. The HVT 524 is switched on by the gate bias circuit 508 during the active mode.

The state of the antifuse 516 is read in the following manner. If the antifuse 516 is programmed and has a low impedance, a voltage that is approximately VREAD less a threshold voltage $V_T$ of the HVT 524 will be coupled to the gate of the transistor 552 to switch it on to couple the drain of the transistor 552 to Vss and generate a low OUTPUT signal. If the antifuse 516 is unprogrammed it will have a high impedance and its dielectric will substantially insulate the read circuit 511 from VREAD on the common bus line 520. The transistor 543 or 545 that is switched on during the active mode will draw current from the read circuit 511 through the transistor 540 to Vss to leave a low voltage coupled to the gate of the transistor 552. The transistor 552 is switched off, and the drains of the transistors 552 and 556 are coupled to Vcc through the transistor 556 to generate a high OUTPUT signal to indicate that the antifuse 516 is unprogrammed.

When unprogrammed, the antifuse 516 can be damaged by undesirable currents. For example, the antifuse 516 and the transistors 524, 540, 541, 543, and 545 behave as a capacitor divider circuit with respect to voltages on the common bus line 520 when the antifuse 516 is unprogrammed. The antifuse 516 behaves as a first capacitor with a relatively small capacitance, and the transistors 524, 540, 541, 543, and 545 behave collectively as a second capacitor with a relatively large capacitance. The smaller relative capacitance of the unprogrammed antifuse 516 means it bears a larger portion of the voltage on the common bus line 520 than do the transistors in the capacitor divider circuit. The antifuse 516 can bear a particularly large voltage difference during the programming mode when the elevated voltage is on the common bus line 520, and this voltage difference can result in tunneling current through the antifuse 516. The tunneling current may not program the antifuse 516, but it can damage the antifuse 516 in a similar way without fully programming it.

The transistors 524, 540, 541, 543, and 545 can also have subthreshold and/or junction leakage current that will pass through the antifuse 516. If the antifuse 516 is unprogrammed, any current leakage through it will degrade its gate dielectric. It is therefore advantageous to reduce sources of current leakage as much as possible.

One or more of the transistors 524, 540, 541, 543, and 545 can have reverse bias junction leakage, also called gate induced drain leakage (GIDL). The transistors 524, 540, 541, 543, and 545 are n-channel transistors each having n+-type source and drain regions separated by a channel region in a p-type substrate. A thin layer of oxide separates the channel region from a gate electrode in each transistor. The n+-type drain region and the p-type substrate comprise a parasitic diode which is reverse biased by a positive voltage on the drain terminal of the transistor which occurs when the elevated voltage is on the common bus line 520. GIDL current may leak across the reverse biased parasitic diode, and this leakage can increase with an increase of an electric field intensity (E) near the drain region which is increased due to the proximity of the gate electrode. GIDL current increases with a rising voltage on the drain terminal of the transistor which raises E near the drain region. GIDL current may be more of a problem in the transistors 524 and 540.

One or more of the transistors 524, 540, 541, 543, and 545 can also have subthreshold current due to drain induced barrier lowering (DIBL). Each of the n-channel transistors 524, 540, 541, 543, and 545 may be switched on to conduct current between its drain and source terminals when the voltage at its gate terminal exceeds the voltage at its source terminal by a threshold voltage VT of the transistor. The difference between the voltage at the gate terminal and the voltage at the source terminal is called $V_{GS}$. DIBL leakage current flows between the drain terminal and the source terminal at a subthreshold $V_{GS}$, when $V_{GS}$ is less than $V_T$ of the transistor. DIBL leakage current therefore occurs when the transistor is switched off, and this current can damage the antifuse 516 when it is unprogrammed. The subthreshold current is increased as the voltage at the drain terminal of the transistor increases when the elevated voltage is on the common bus line 520, and the DIBL leakage current can therefore occur at lower and lower values of $V_{GS}$. If the voltage at the drain terminal is high enough, DIBL leakage current can occur when $V_{GS}$ is zero. DIBL leakage current may be more of a problem in the transistors 541, 543, and 545.

The entire disclosure of U.S. application Ser. No. 09/652,429 entitled GATE DIELECTRIC ANTIFUSE CIRCUITS AND METHODS FOR OPERATING SAME and filed on Aug. 31, 2000, is incorporated herein by reference. application Ser. No. 09/652,429 addresses the reduction of snapback and DIBL and GIDL leakage current described above.

Free electrons in a substrate of the integrated circuit including the program driver circuit 510 can also cause unwanted current in the unprogrammed antifuse 516. The free electrons will collect in the n+-type drain diffusion region of the HVT 524 and pass through the unprogrammed antifuse 516.

Embodiments of the present invention include circuits to shunt or bypass current around the unprogrammed antifuse 516 during the programming mode to protect the antifuse 516. The circuits may be called shunt circuits or bypass circuits or pre-charge circuits and are coupled in parallel with the antifuse 516 between the common bus line 520 and the program driver circuit 510. The shunt circuits or bypass circuits or pre-charge circuits conduct current between the common bus line 520 and the program driver circuit 510 that does not pass through the antifuse 516. Examples of a shunt circuit or a bypass circuit or a pre-charge circuit include the bypass circuit 270 or the pre-charge circuit 272 shown in FIG. 2 that shunt or bypass current around the antifuse 210.

Figure 5B:
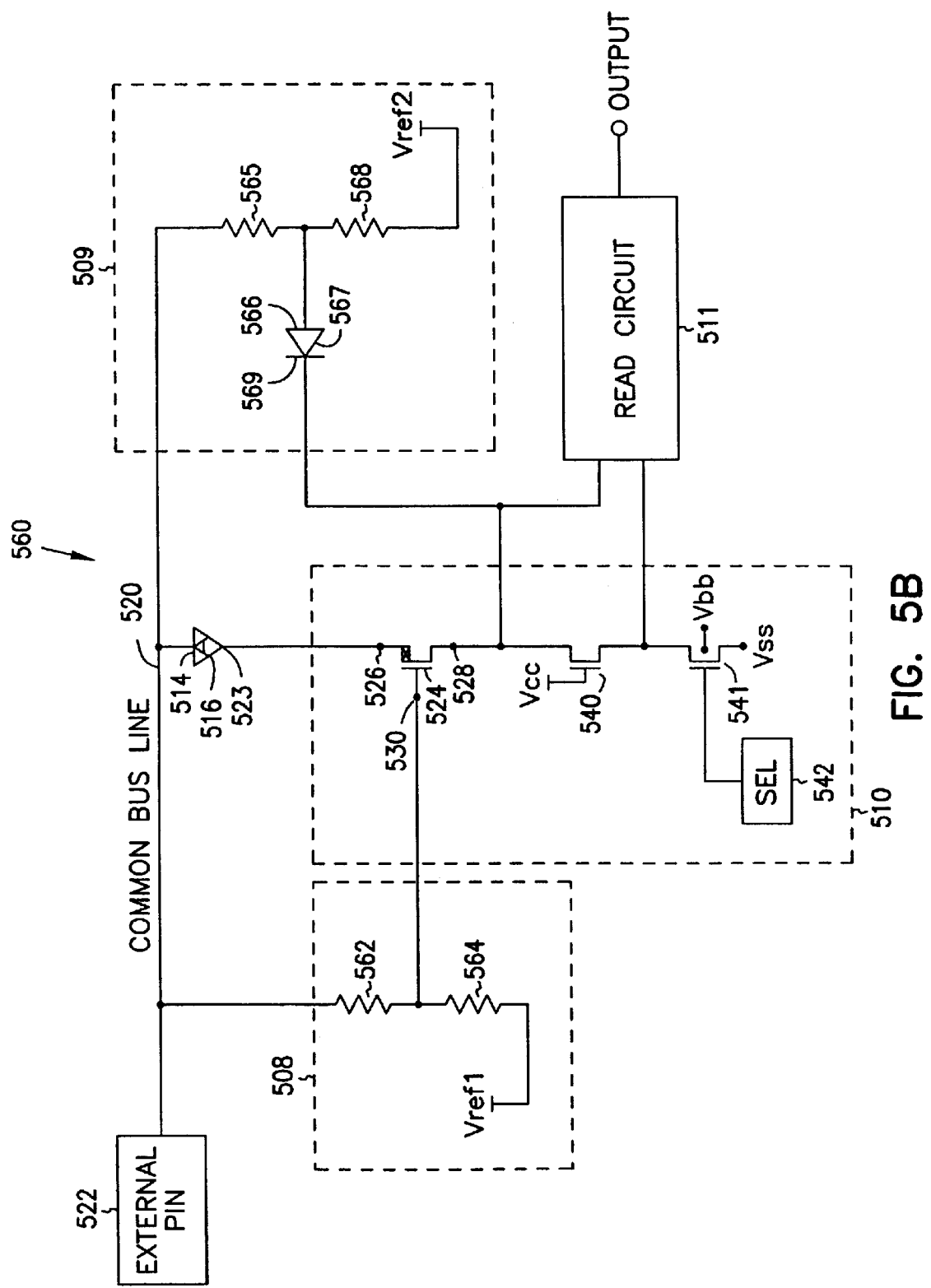
FIG. 5B is an electrical schematic diagram of support circuits for antifuses according to an embodiment of the present invention.

Several of the circuits in the antifuse bank 200 shown in FIG. 2 are shown in greater detail in FIG. 5B. An electrical schematic diagram of several support circuits 560 for programming and reading antifuses is shown in FIG. 5B according to an embodiment of the present invention. The circuits 560 have many elements that are similar to the elements of the circuits 500 shown in FIG. 5A. Elements common to both of the circuits 500 and 560 have been given the same reference numerals and will not be described, and the details of the read circuit 511 have not been shown, for purposes of brevity.

The gate bias circuit 508 shown in FIG. 5A is shown in more detail in FIG. 5B. The gate bias circuit 508 includes a first impedance 562 coupled between the common bus line 520 and the gate terminal 530 of the HVT 524. The gate bias circuit 508 also includes a second impedance 564 coupled between the gate terminal 530 and a first reference voltage Vref1. The first impedance 562 and the second impedance 564 form a voltage divider and couple a voltage between Vref1 and VREAD to the gate terminal 530 during the active mode and sleep mode. Vref1 could be Vcc or Vss or any voltage between them. VREAD is on the common bus line 520 during the active mode and the sleep mode and may be more or less or approximately equal to Vcc. The first impedance 562 and the second impedance 564 couple a voltage between Vref1 and the elevated voltage to the gate terminal 530 during the programming mode of operation when the elevated voltage is on the common bus line 520. The voltage on the gate terminal 530 during the programming mode is determined by a ratio of the impedances 562 and 564, and this ratio is selected to protect the HVT 524 as will be described hereinbelow. The first impedance 562 and the second impedance 564 may each be a resistor or a transistor or other electric or electronic element that provides an electrical impedance. The first impedance 562 and the second impedance 564 may comprise a combination of different types of impedances such as a combination of a resistor and a transistor or multiple resistors and transistors or various combinations of resistors, transistors, and other elements that provide an electrical impedance.

The pre-charge circuit 509 shown in FIG. 5A is shown in more detail in FIG. 5B. The pre-charge circuit 509 is an analog voltage generator circuit having an impedance, and includes a third impedance 565 coupled between the common bus line 520 and an anode 566 of a diode 567. The pre-charge circuit 509 also includes a fourth impedance 568 coupled between the anode 566 of the diode 567 and a second reference voltage Vref2. Vref2 could be Vcc or Vss or any voltage between them. A cathode 569 of the diode 567 is coupled to the source terminal 528 of the HVT 524. The third impedance 565 and the fourth impedance 568 form a voltage divider and couple an analog voltage between Vref2 and the elevated voltage, less a voltage drop due to the diode 567, to the source terminal 528 of the HVT 524 during the programming mode of operation when the elevated voltage is on the common bus line 520. The program driver circuit 510 receives current from the pre-charge circuit 509 through the diode 567 to replace current lost through subthreshold current or junction leakage, or to displace free electrons in the program driver circuit 510. The pre-charge circuit 509 pre-charges the capacitive structures in the program driver circuit 510 and the read circuit 511 below the antifuse 516 before it is programmed during the programming mode. An unprogrammed antifuse 516 is protected by the current provided by the pre-charge circuit 509 that displaces current that may otherwise have been drawn through the antifuse 516. The diode 567 substantially prevents charge from migrating to the pre-charge circuit 509 during the programming mode when the antifuse 516 is programmed and there is a high voltage on the source terminal 528 of the HVT 524. The pre-charge circuit 509 is coupled to multiple antifuse modules in the antifuse bank 200 shown in FIG. 2 that might otherwise be damaged by the high voltage. The third impedance 565 and the fourth impedance 568 may each be a resistor or a transistor or other electric or electronic element that provides an electrical impedance. The third impedance 565 and the fourth impedance 568 may comprise a combination of different types of impedances such as a combination of a resistor and a transistor or multiple resistors and transistors or various combinations of resistors, transistors, and other elements that provide an electrical impedance.

Resistance values of the third impedance 565 and the fourth impedance 568 are large so that the diode 567 sources a low level of current from the common bus line 520 to the program driver circuit 510 during the programming mode.

Figure 5C:
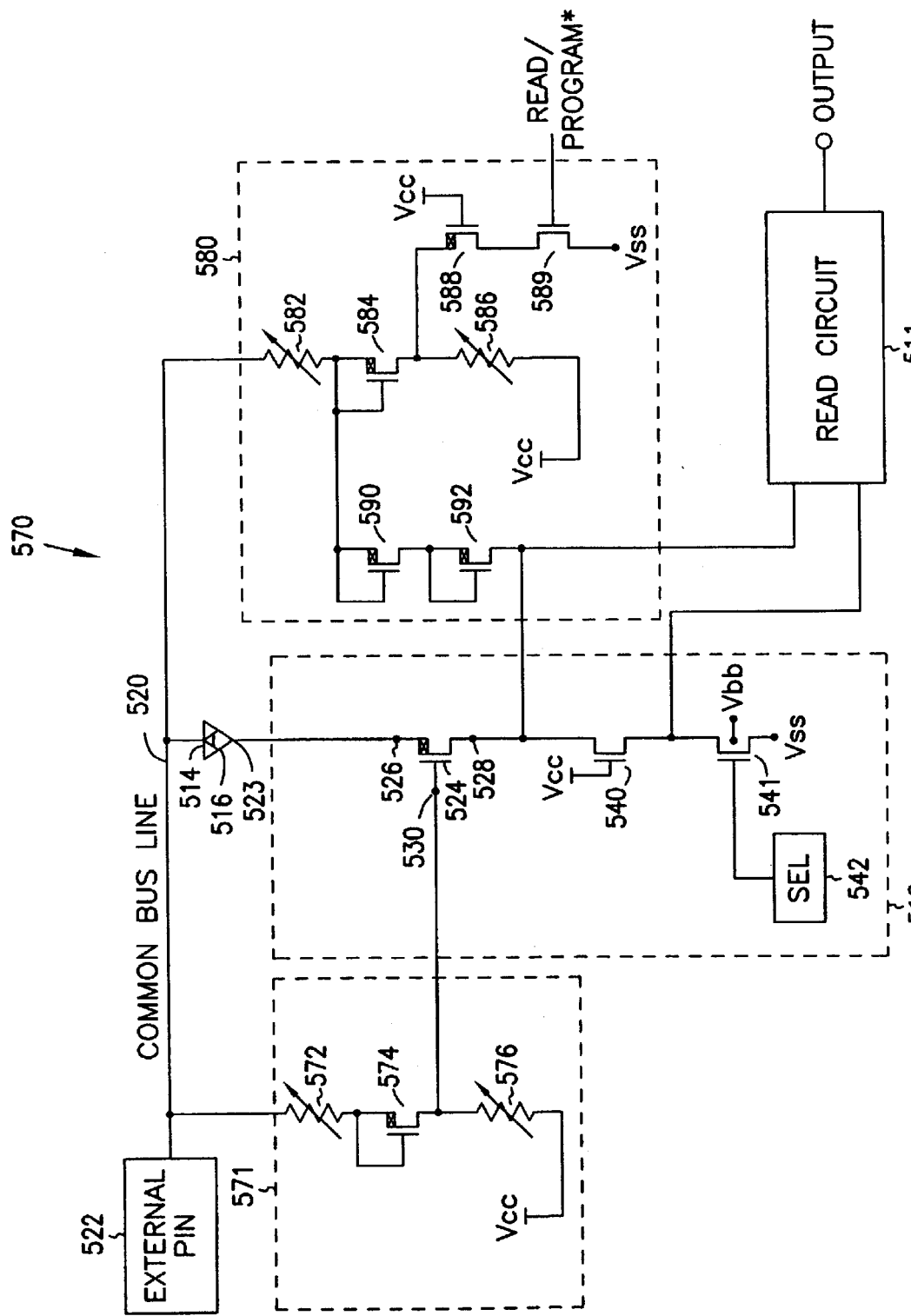
FIG. 5C is an electrical schematic diagram of support circuits for antifuses according to an embodiment of the present invention.

Several of the circuits in the antifuse bank 200 shown in FIG. 2 are shown in greater detail in FIG. 5C. An electrical schematic diagram of several support circuits 570 for programming and reading antifuses is shown in FIG. 5C according to an embodiment of the present invention. The circuits 570 have many elements that are similar to the elements of the circuits 560 shown in FIG. 5B, and elements common to both of the circuits 560 and 570 have been given the same reference numerals and will not be described for purposes of brevity. The circuits 570 of FIG. 5C include a gate bias circuit 571 and a pre-charge circuit 580 according to other embodiments of the present invention that replace the gate bias circuit 508 and the pre-charge circuit 509 shown in FIGS. 5A and 5B.

The gate bias circuit 571 includes a first adjustable resistor 572 and a HVT 574 coupled in series between the common bus line 520 and the gate terminal 530 of the HVT 524. A gate and a drain of the HVT 574 are coupled together to the first adjustable resistor 572 and a source of the HVT 574 is coupled to the gate terminal 530 such that the HVT 574 is diode-connected. The gate bias circuit 571 also includes a second adjustable resistor 576 coupled between the gate terminal 530 and Vcc. The first adjustable resistor 572, the HVT 574, and the second adjustable resistor 576 form a voltage divider. The first adjustable resistor 572, the HVT 574, and the second adjustable resistor 576 couple a voltage of between Vcc and VREAD to the gate terminal 530 during the active mode and the sleep mode when VREAD is on the common bus line 520. The first adjustable resistor 572, the HVT 574, and the second adjustable resistor 576 couple a voltage between Vcc and the elevated voltage to the gate terminal 530 during the programming mode of operation when the elevated voltage is on the common bus line 520. The voltage on the gate terminal 530 during the programming mode is determined by a ratio of the impedances of the first adjustable resistor 572, the HVT 574, and the second adjustable resistor 576, and this ratio is selected to protect the HVT 524 as will be described hereinbelow. The first adjustable resistor 572 and the second adjustable resistor 576 may comprise a combination of different types of impedances such as a combination of a resistor and a transistor or multiple resistors and transistors or various combinations of resistors, transistors, and other elements that provide an electrical impedance.

The pre-charge circuit 580 is an analog voltage generator circuit having an impedance. The pre-charge circuit 580 includes a first adjustable resistor 582, a HVT 584, and a second adjustable resistor 586 coupled in series between the common bus line 520 and Vcc. A gate and a drain of the HVT 584 are coupled together to the first adjustable resistor 582 such that the HVT 584 is diode-connected. A source of the HVT 584 is coupled to the second adjustable resistor 586 and to a drain of a HVT 588. A gate of the HVT 588 is coupled to Vcc, and a source of the HVT 588 is coupled to a drain of an n-channel transistor 589. A source of the transistor 589 is coupled to Vss, and a gate of the transistor 589 is coupled to receive a READ/PROGRAM* signal that is more fully described hereinbelow.

A pair of top and bottom diode-connected HVTs 590 and 592 are coupled in series between the drain of the HVT 584 and the source terminal 528 of the HVT 524. Each of the top and bottom diode-connected HVTs 590 and 592 have a gate and a drain coupled together, and the drain of the bottom diode-connected HVT 592 is coupled to a source of the top diode-connected HVT 590. A source of the bottom diode-connected HVT 592 is coupled to the source terminal 528 of the HVT 524. Gates and drains of the top diode-connected HVT 590 and the HVT 584 are coupled together.

The first adjustable resistor 582, the HVT 584, and the second adjustable resistor 586 thereby form a voltage divider to couple an analog voltage between Vcc and the elevated voltage, less a voltage drop due to the top and bottom diode-connected HVTs 590 and 592, to the source terminal 528 of the HVT 524 during the programming mode of operation when the elevated voltage is on the common bus line 520. The analog voltage may be one threshold voltage above the voltage applied to the gate terminal 530 by the gate bias circuit 571 during the programming mode by appropriate selection of the impedances of the first adjustable resistor 582, the HVT 584, and the second adjustable resistor 586. The program driver circuit 510 receives current from the pre-charge circuit 580 through the top and bottom diode-connected HVTs 590 and 592 to replace current lost through subthreshold current or junction leakage, or to displace free electrons in the program driver circuit 510. An unprogrammed antifuse 516 is protected by the current provided by the pre-charge circuit 580 that displaces current that may otherwise have been drawn through the antifuse 516.

The top and bottom diode-connected HVTs 590 and 592 substantially prevent charge from migrating to the pre-charge circuit 580 during the programming mode when the antifuse 516 is programmed and there is a high voltage on the source terminal 528 of the HVT 524. The pre-charge circuit 580 is coupled to multiple antifuse modules in the antifuse bank 200 shown in FIG. 2 that might otherwise be damaged by the high voltage.

The READ/PROGRAM* signal coupled to the gate of the transistor 589 is low during the programming mode such that the transistor 589 is switched off and a voltage at the source of the HVT 584 can rise above Vss. During the active mode, the READ/PROGRAM* signal is high to switch on the transistor 589 and couple the source of the HVT 584 to Vss through the transistor 589 and the HVT 588. The HVT 588 is switched on when the transistor 589 is switched on. Current from the common bus line 520 passes through the HVT 584, the HVT 588, and the transistor 589 to Vss during the active mode, and is thereby substantially prevented from migrating to the read circuit 511 through the top and bottom diode-connected HVTs 590 and 592 during the active mode.

The first adjustable resistor 582 and the second adjustable resistor 586 may comprise a combination of different types of impedances such as a combination of a resistor and a transistor or multiple resistors and transistors or various combinations of resistors, transistors, and other elements that provide an electrical impedance.

Resistance values of the first adjustable resistor 582 and the second adjustable resistor 586 are large so that the top and bottom diode-connected HVTs 590 and 592 source a low level of current from the common bus line 520 to the program driver circuit 510 during the programming mode.

A voltage ramp rate on the common bus line 520 is not to exceed time constants of elements in the pre-charge circuit 580.

A voltage sweep of the antifuse 516 may be carried out in the following manner once the antifuse 516 has been programmed to determine its resistive characteristics. The transistors 543 and 545 are switched off, and the transistor 541 is switched on by the control logic circuit CTLT 546 to control current flow through the program driver circuit 510 to Vss. A voltage on the common bus line 520 is varied and current on the common bus line 520 that passes through the program driver circuit 510 is measured to determine the current/voltage characteristics of the programmed antifuse 516. The voltage on the common bus line 520 is varied above or below Vss such that data for the voltage sweep is obtained for voltages near Vss. The gate terminal 530 of the HVT 524 is maintained at approximately Vcc by the gate bias circuit 571 so that the resistance of the HVT 524 remains relatively unchanged during the sweep, and the diode-connected HVT 574 substantially prevents current flow from the gate bias circuit 571 to the common bus line 520 during the voltage sweep.

With reference to the antifuse bank 200 shown in FIG. 2, once an antifuse such as the antifuse 210 is programmed, it is an impedance element similar to a resistor, and provides a possible current path from the common bus line 230. It is desirable to limit current on the common bus line 230, and therefore additional sources of current on the common bus line 230 are to be substantially eliminated as far as is possible.

Each of the gate bias circuits 508 and 571 shown in FIGS. 5A, 5B, and 5C help to substantially reduce current flow through the HVT 524 from the common bus line 520 during the programming mode when the common bus line 520 is at the elevated voltage and the antifuse 516 is programmed. The elevated voltage may induce breakdown current in the HVT 524, and this does not occur through its substrate because of the high drain breakdown voltage of the HVT 524.

Each of the gate bias circuits 508 and 571 may substantially prevent breakdown current across the gate dielectric of the HVT 524 during the programming mode. An example is illustrated with reference to the transistor 400 and the circuits 560 shown in FIGS. 4 and 5B. The drain terminal 526 is connected to the drain diffusion region 432, the gate terminal 530 is connected to the electrode 424, and the source terminal 528 is connected to the source diffusion region 430. The voltage at the electrode 424 is insulated from the voltage at the drain diffusion region 432 by the gate dielectric 422. However, current will flow across the gate dielectric 422 if a voltage differential between the drain diffusion region 432 and the electrode 424 is large. The gate dielectric 422 may even break down and become a resistive element if the voltage differential is large enough.

The gate bias circuit 508 in the circuits 500 and 560 raises the gate terminal 530 to a voltage between Vref1 and the elevated voltage during the programming mode, such that a voltage difference across the gate dielectric 422 is too small to induce current flow through the gate dielectric 422 to the electrode 424. The gate bias circuit 508 thereby reduces damage to the gate dielectric 422 by reducing the voltage drop across the gate dielectric 422 when the antifuse 516 is programmed and the common bus line 520 is at the elevated voltage. If the gate terminal 530 were held at a lower voltage such as Vref1, then the large voltage differential might cause continuous current and damage the gate dielectric 422 when the drain terminal 526 was near the elevated voltage. Similarly, the gate bias circuit 571 in the circuits 570 raises the gate terminal 530 to a voltage between Vcc and the elevated voltage during the programming mode.

The voltage on the gate terminal 530 during the programming mode is determined by the ratio of the impedances 562 and 564 in the gate bias circuit 508, or by the ratio of the impedances of the first adjustable resistor 572, the HVT 574, and the second adjustable resistor 576 in the gate bias circuit 571. The ratios of these impedances are selected such that the voltage on the gate terminal 530 during the programming mode is high enough such that a voltage difference across the gate dielectric 422 in the HVT 524 is too small to induce current flow through the gate dielectric 422 after the antifuse 516 has been programmed, but not so high as to damage the gate dielectric 422 when the antifuse 516 is being programmed. With reference to FIG. 6 and its description above, a voltage at the source terminal 528 of the HVT 524 is nearly Vss during the percolation period 604 when the antifuse 516 is intact. If the voltage on the gate terminal 530 during the programming mode is too high, current may flow between the source diffusion region 430 and the electrode 424 across the gate dielectric 422, and the gate dielectric 422 may break down. The ratio of the impedances 562 and 564 in the gate bias circuit 508, or the ratio of the impedances of the first adjustable resistor 572, the HVT 574, and the second adjustable resistor 576 in the gate bias circuit 571, are selected such that the voltage on the gate terminal 530 during the programming mode is low enough to substantially prevent current flow across the gate dielectric 422 when the antifuse 516 is being programmed, and is high enough to substantially prevent current flow across the gate dielectric 422 after the antifuse 516 has been programmed.

Figure 7A:
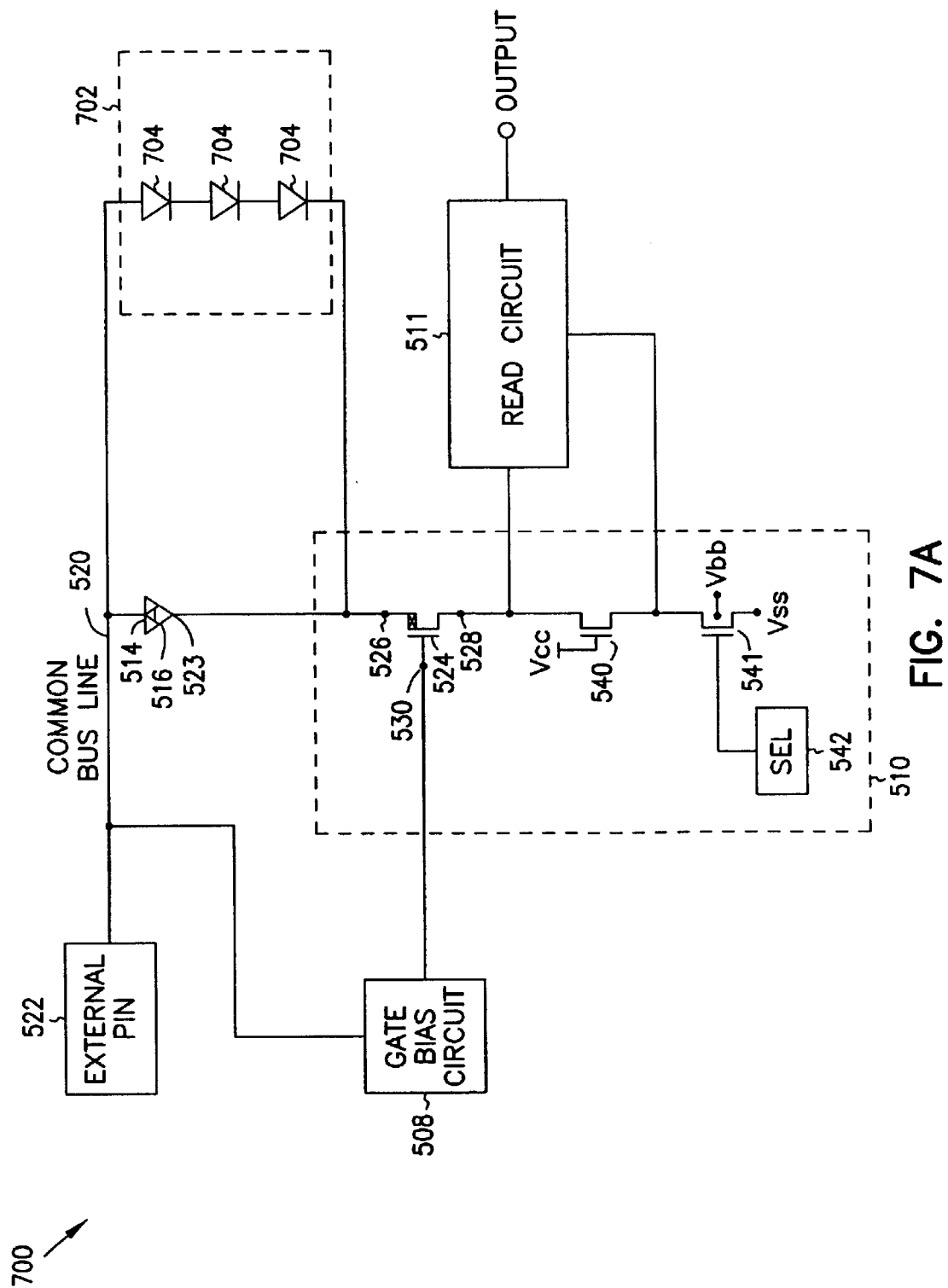
FIG. 7A is an electrical schematic diagram of support circuits for antifuses according to an embodiment of the present invention.

Several of the circuits in the antifuse bank 200 shown in FIG. 2 are shown in greater detail in FIG. 7A. An electrical schematic diagram of several support circuits 700 for programming and reading antifuses is shown in FIG. 7A according to an embodiment of the present invention. The circuits 700 have many elements that are similar to the elements of the circuits 500 shown in FIG. 5A, and elements common to both of the circuits 500 and 700 have been given the same reference numerals and will not be described for purposes of brevity. The circuits 700 of FIG. 7A include a bypass circuit 702 according to an embodiment of the present invention. The bypass circuit 702 shunts or bypasses current around the antifuse 516 in a manner similar to the bypass circuit 270 of the antifuse bank 200 shown in FIG. 2.

The bypass circuit 702 includes multiple diodes 704 coupled in series between the common bus line 520 and the well 523 of the antifuse 516. Three diodes 704 are shown in the bypass circuit 702, but more or less than three diodes 704 may be included in the bypass circuit 702 according to alternate embodiments of the present invention. An anode of one of the diodes 704 is coupled to the common bus line 520, and a cathode of another one of the diodes 704 is coupled to the well 523 of the antifuse 516. Others of the diodes 704 have an anode coupled to a cathode of a preceding diode 704, and a cathode coupled to an anode of a succeeding diode 704. The diodes 704 shunt or bypass a low level of current around the antifuse 516 from the common bus line 520 to the program driver circuit 510 during the programming mode when the elevated voltage is on the common bus line 520. The antifuse 516 is programmed when the transistor 541 is switched on, and the transistor 541 draws substantially more current than the diodes 704 can pass such that a sufficient voltage difference is applied to program the antifuse 516.

The number of diodes 704 coupled together in the bypass circuit 702 is selected such that current drawn through the bypass circuit 702 is less than ten percent of a load current that would be drawn through the antifuse 516 if it were being read after having been programmed. The number of diodes 704 is selected assuming the worst-case operating conditions of the circuits 700 including such conditions as operating temperature and Vcc.

Figure 7B:
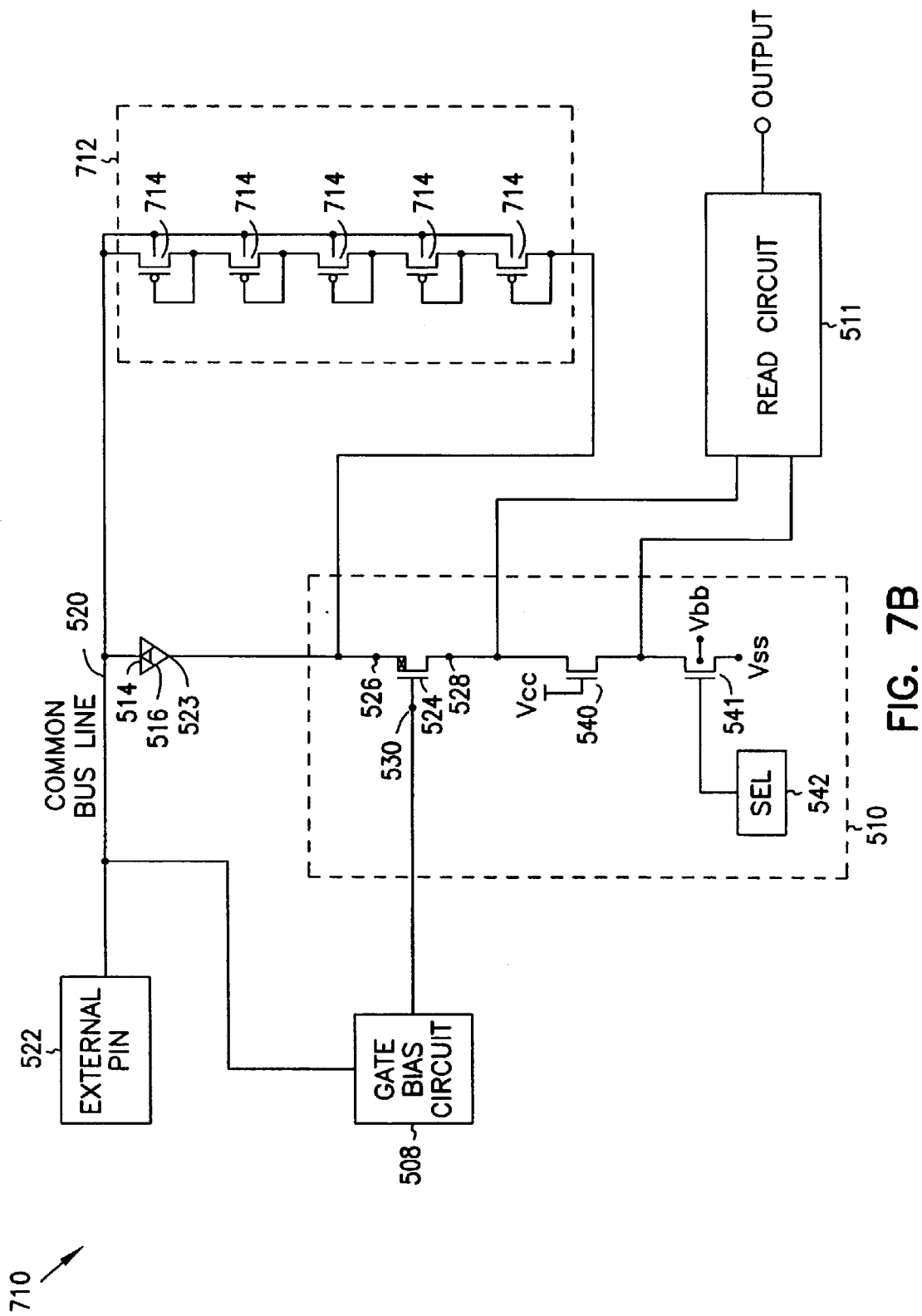
FIG. 7B is an electrical schematic diagram of support circuits for antifuses according to an embodiment of the present invention.

Several of the circuits in the antifuse bank 200 shown in FIG. 2 are shown in greater detail in FIG. 7B. An electrical schematic diagram of several support circuits 710 for programming and reading antifuses is shown in FIG. 7B according to an embodiment of the present invention. The circuits 710 have many elements that are similar to the elements of the circuits 700 shown in FIG. 7A, and elements common to both of the circuits 700 and 710 have been given the same reference numerals and will not be described for purposes of brevity. The circuits 710 of FIG. 7B include a bypass circuit 712 according to an embodiment of the present invention. The bypass circuit 712 shunts or bypasses current around the antifuse 516 in a manner similar to the bypass circuit 702 of the circuits 700 shown in FIG. 7A or the bypass circuit 270 of the antifuse bank 200 shown in FIG. 2.

The bypass circuit 712 includes multiple p-channel transistors 714 coupled as diodes in series between the common bus line 520 and the well 523 of the antifuse 516. Five diode-connected p-channel transistors 714 are shown in the bypass circuit 712, but more or less than the five diode-connected p-channel transistors 714 may be included in the bypass circuit 712 according to alternate embodiments of the present invention. The number of diode-connected p-channel transistors 714 in the bypass circuit 712 is determined with an analysis similar to the analysis described above to determine the number of diodes 704 in the bypass circuit 702. A source of one of the transistors 714 is coupled to the common bus line 520, and a gate and a drain of another one of the transistors 714 is coupled to the well 523 of the antifuse 516. Others of the transistors 714 have a source coupled to a drain of a preceding transistor 714, and a gate and a drain coupled to a source of a succeeding transistor 714. The transistors 714 each have a substrate coupled to the common bus line 520. The transistors 714 shunt or bypass a low level of current around the antifuse 516 from the common bus line 520 to the program driver circuit 510 during the programming mode when the elevated voltage is on the common bus line 520.

Figure 7C:
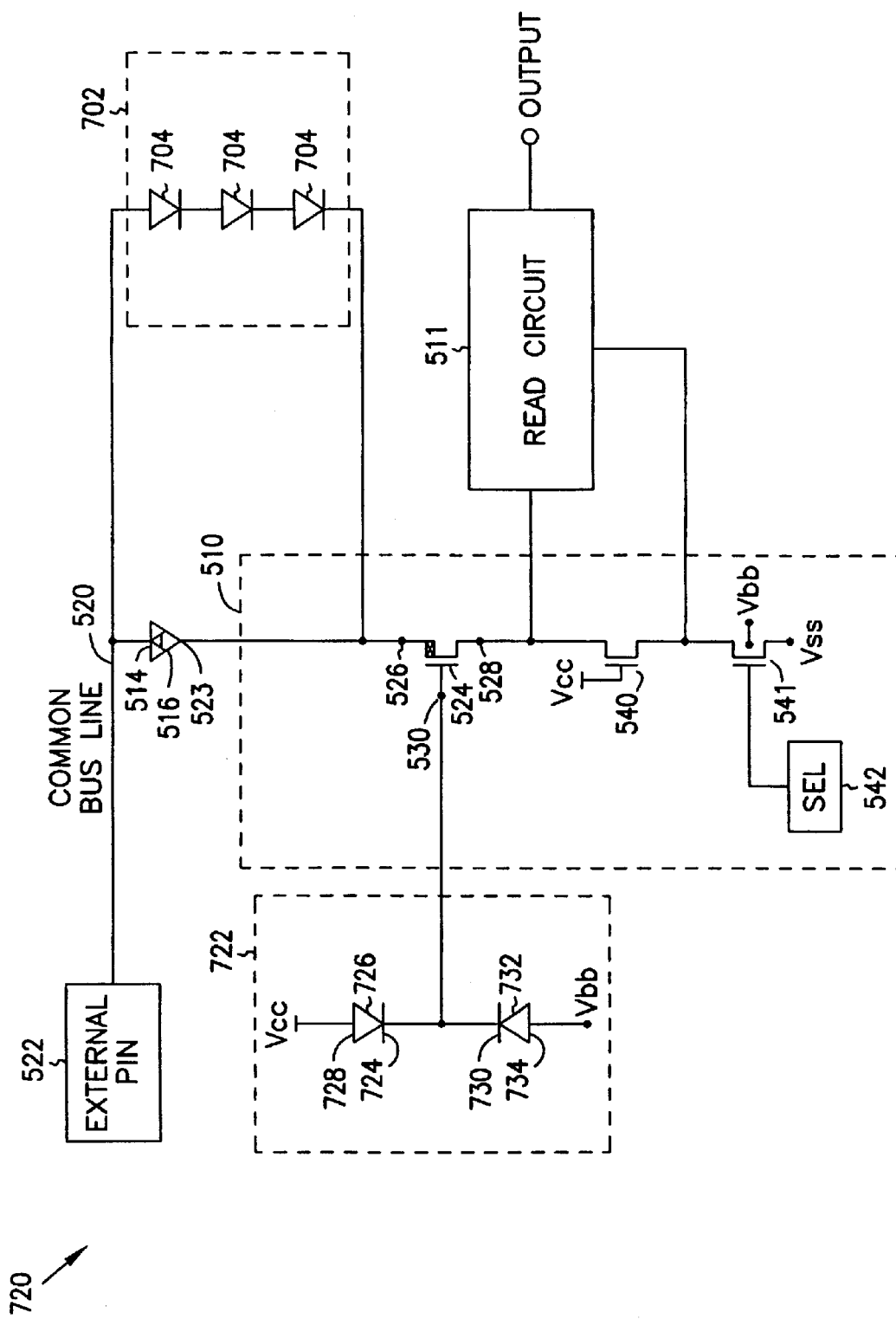
FIG. 7C is an electrical schematic diagram of support circuits for antifuses according to an embodiment of the present invention.

Several of the circuits in the antifuse bank 200 shown in FIG. 2 are shown in greater detail in FIG. 7C. An electrical schematic diagram of several support circuits 720 for programming and reading antifuses is shown in FIG. 7C according to an embodiment of the present invention. The circuits 720 have many elements that are similar to the elements of the circuits 700 shown in FIG. 7A, and elements common to both of the circuits 700 and 720 have been given the same reference numerals and will not be described for purposes of brevity.

The circuits 720 include the bypass circuit 702 shown and described with reference to FIG. 7A that shunts or bypasses current around the antifuse 516. In addition, the gate bias circuit 508 is removed and replaced by a diode structure 722.

The gate terminal 530 of the HVT 524 is coupled to a cathode 724 of a diode 726, and an anode 728 of the diode 726 is coupled to Vcc. The diode 726 is forward biased as long as Vcc exceeds a voltage at the gate terminal 530. The gate terminal 530 is coupled to a cathode 730 of a diode 732. An anode 734 of the diode 732 is coupled to Vbb. The diodes 726 and 732 maintain the gate terminal 530 at a voltage slightly less than Vcc, or higher. The entire disclosure of U.S. application Ser. No. 09/652,429 entitled GATE DIELECTRIC ANTIFUSE CIRCUITS AND METHODS FOR OPERATING SAME and filed on Aug. 31, 2000, is incorporated herein by reference, and includes figures and a description of a diode structure similar to the diode structure 722.

A voltage ramp rate on the common bus line 520 is low in alternate embodiments of the present invention to substantially prevent an excessive voltage across the antifuse 516 that may be caused by a limited current sourcing ability of the bypass circuits 702 or 712.

The program driver circuit 51 0 shown in FIGS. 5A, 5B, 5C, 7A, 7B, and 7C is different in alternate embodiments of the present invention. For example, different circuits 510 have different HVTs, or one may have a cascode coupling of the transistors 540 and 541 and the other may have only a single corresponding transistor 541. Different circuits 510 have different gate bias circuits or a diode structure such as those described with reference to FIGS. 5B, 5C, and 7C or different bypass circuits or pre-charge circuits such as those described with reference to FIGS. 5B, 5C, 7A, 7B, and 7C according to alternate embodiments of the present invention.

Figure 8:
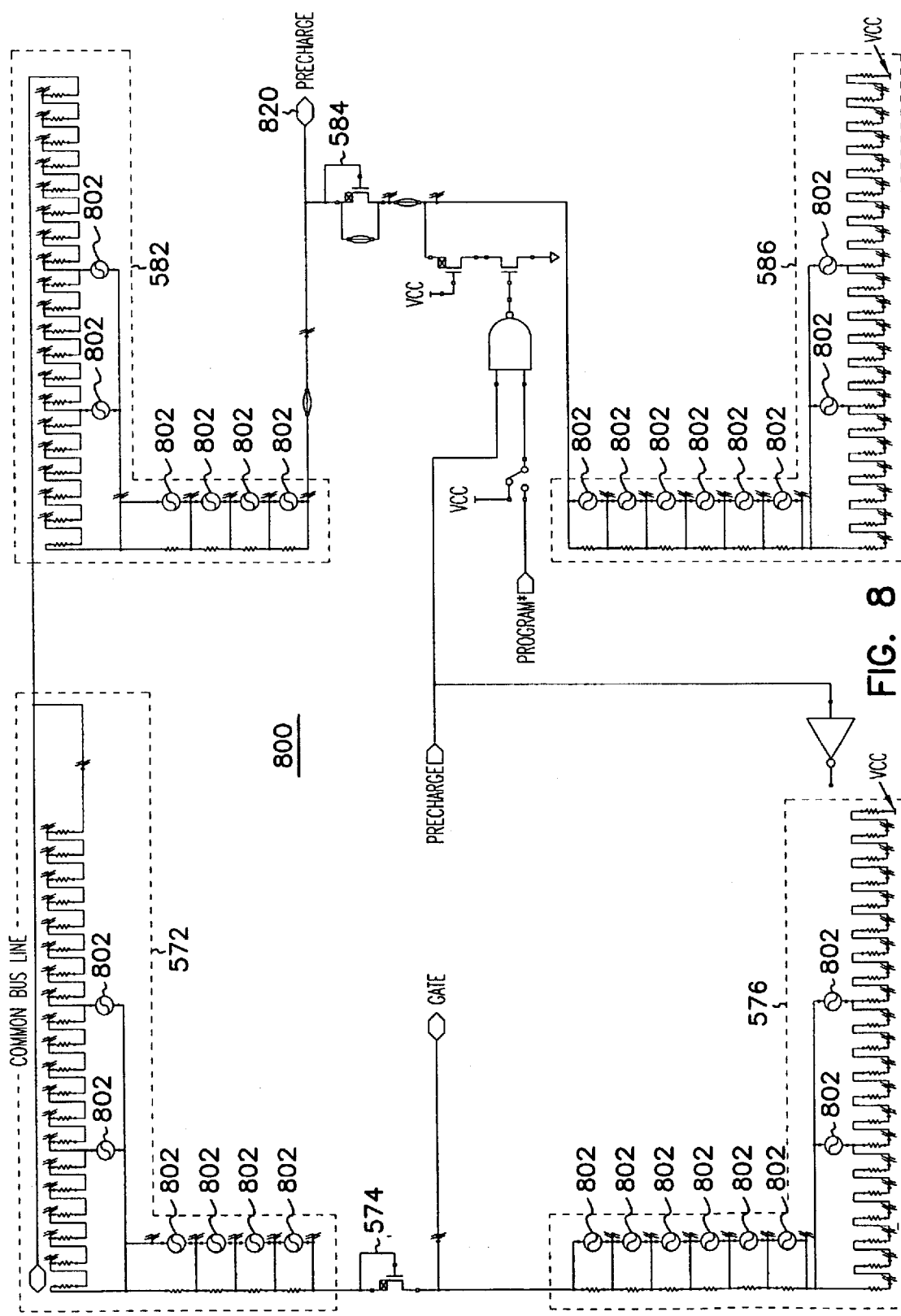
FIG. 8 is an electrical schematic diagram of support circuits for antifuses according to an embodiment of the present invention.

An electrical schematic diagram of support circuits 800 for programming and reading antifuse is shown in FIG. 8 according to an embodiment of the present invention. The circuits 800 show in greater detail the adjustable resistors 572, 576, 582, and 586 and the HVTs 574 and 584 shown in FIG. 5C. Each of the adjustable resistors 572, 576, 582, and 586 comprise resistors formed in parallel with fuses 802. The fuses 802 are short circuit connections that can be evaporated by a laser beam to create open circuits during the manufacture of an integrated circuit. One or more of the fuses 802 are evaporated by the laser beam to set the impedance values of the adjustable resistors 572, 576, 582, and 586 to determine the voltage applied to the gate 530 of the HVT 524 and the pre-charge current supplied to the program driver circuit 510 through a node 820 during the programming mode of operation. The impedance values of the adjustable resistors 572, 576, 582, and 586 can also be set with a metal mask in a fabrication process that selects metal options to shunt the resistors according to alternate embodiments of the present invention.

Figure 9:
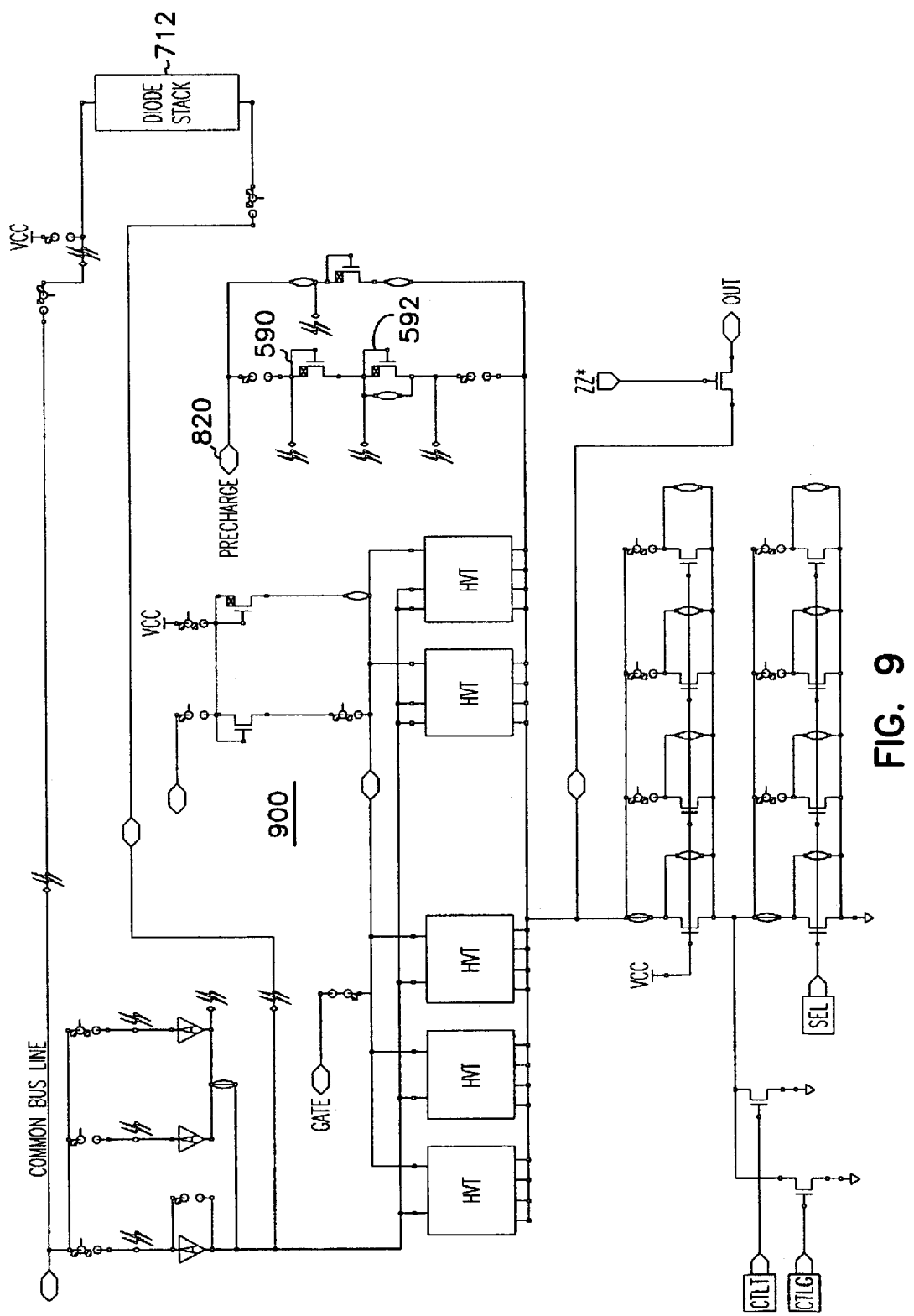
FIG. 9 is an electrical schematic diagram of support circuits for antifuses according to an embodiment of the present invention.

An electrical schematic diagram of support circuits 900 for programming and reading antifuses is shown in FIG. 9 according to an embodiment of the present invention. The circuits 900 show an alternative embodiment of the program driver circuit 510 and the read circuit 511 shown in FIG. 5A. The circuits 900 also include the HVTs 590 and 592 shown in FIG. 5C, the bypass circuit 712 shown in FIG. 7B coupled in parallel with antifuses, and the node 820 shown in FIG. 8. The bypass circuit 712 may also be called a diode stack.

Figure 10:
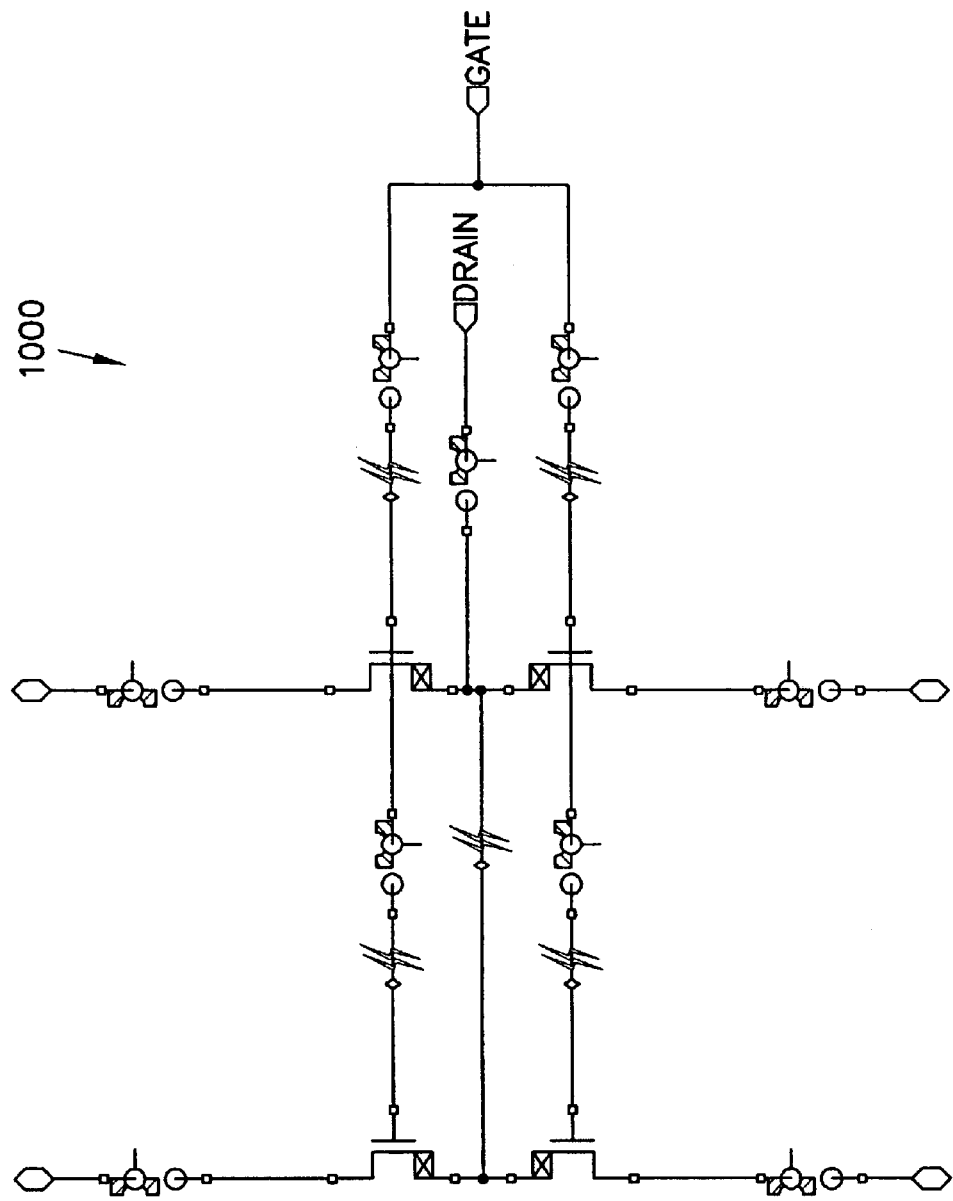
FIG. 10 is an electrical schematic diagram of support circuits for antifuses according to an embodiment of the present invention.

An electrical schematic diagram of support circuits 1000 for programming and reading antifuses is shown in FIG. 10 according to an embodiment of the present invention. The circuits 1000 show in greater detail HVTs that are shown in FIG. 9.

Figure 11:
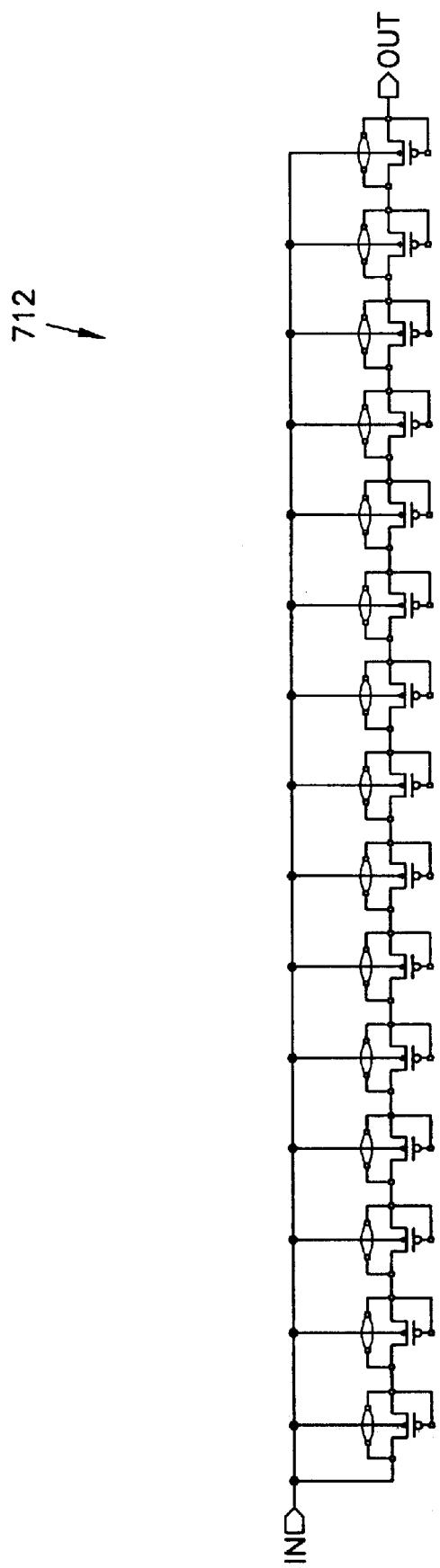
FIG. 11 is an electrical schematic diagram of support circuits for antifuses according to an embodiment of the present invention.

In FIG. 11 an electrical schematic diagram of the bypass circuit 712 is shown according to another embodiment of the present invention. The bypass circuit 712 includes multiple p-channel transistors coupled in series.

Figure 12:
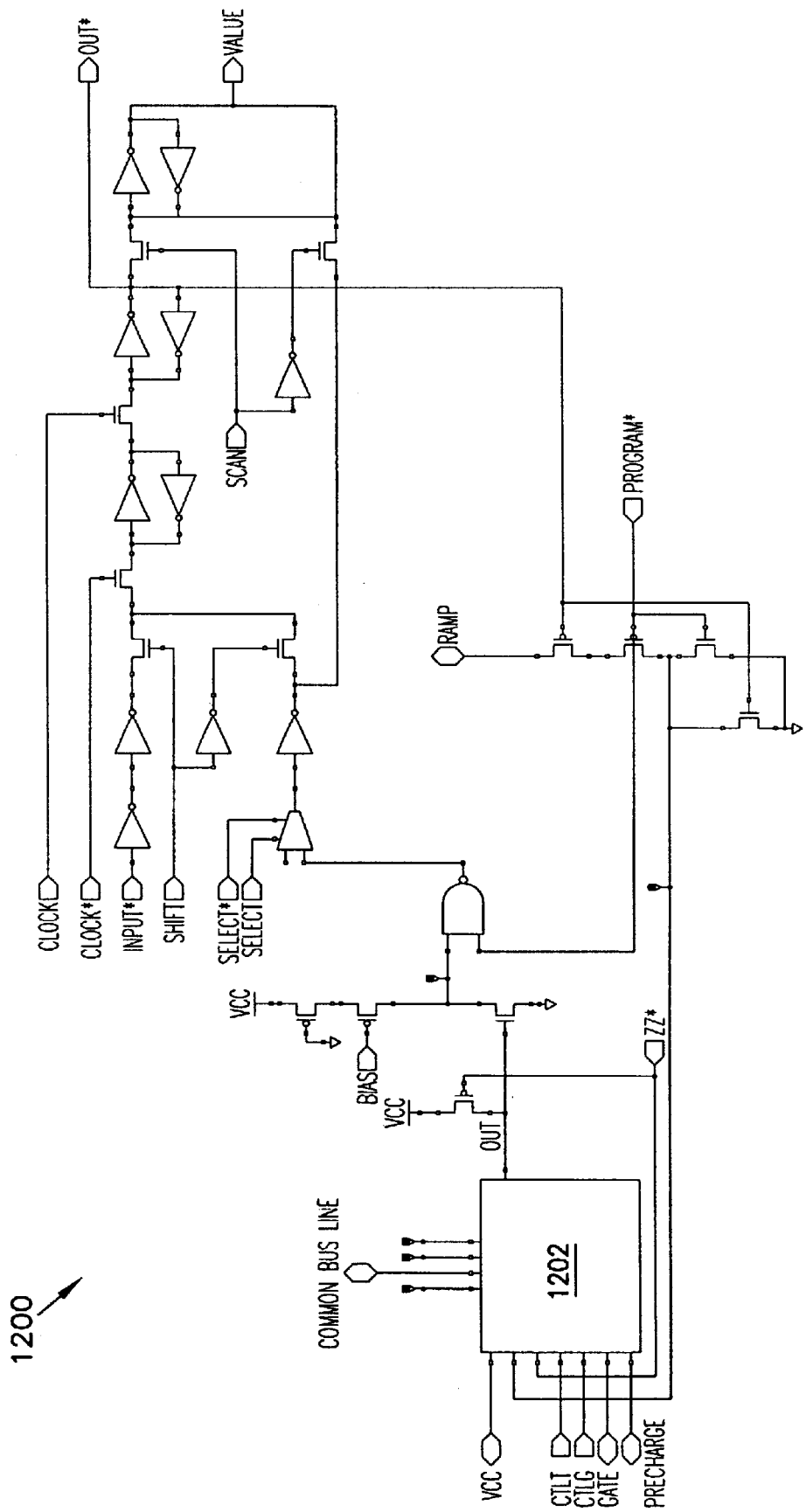
FIG. 12 is an electrical schematic diagram of support circuits for antifuses according to an embodiment of the present invention.

An electrical schematic diagram of support circuits 1200 for programming and reading antifuses is shown in FIG. 12 according to an embodiment of the present invention. The circuits 1200 show the program driver circuit 510 and the read circuit 511 shown in FIG. 5A in a block 1202 with additional circuits used to select and program antifuses.

The embodiments of the present invention shown and described herein help protect an unprogrammed antifuse from damage.

The antifuse 100 shown in FIG. 1 and the transistors 300 and 400 shown in FIGS. 3 and 4 are formed in wells within other wells or tanks rather than the substrates shown in alternate embodiments of the present invention. Such wells or tanks may be situated with other wells or tanks, or within other wells or tanks, in a larger substrate. The wells or tanks may also be situated in a silicon-on-insulator (SOI) device.

Circuits shown and described herein according to embodiments of the present invention, including the circuits shown in FIGS. 5A, 5B, 5C, 7A, 7B, and 7C include one or more HVTs. The same type of HVT is used several times in the same circuit, or combinations of the different HVTs 300 and 400 are used in the same circuit in alternate embodiments of the present invention.

An integrated circuit fabricated with one or more of the antifuses and circuits described above may be tested in a test mode. For example, an integrated circuit having a bank of antifuses is prestressed by applying a prestress voltage that is less than the elevated voltage used to program the antifuses. The antifuses are exposed to the prestress voltage and weaker antifuses are programmed as a result. The antifuses are then read to indicate the antifuse that have been programmed. The antifuses may be read by determining their analog resistances, by detecting a digital output of an addressed antifuse, or by detecting digital output from an addressed antifuse compared with several different load elements.

The entire disclosure of U.S. application Ser. No. 09/652,429 entitled GATE DIELECTRIC ANTIFUSE CIRCUITS AND METHODS FOR OPERATING SAME and filed on Aug. 31, 2000, is incorporated herein by reference. The application Ser. No. 09/652,429 discloses circuits such as read circuits and driver circuits that may be used with and coupled to the embodiments of the present invention described herein.

Figure 13:
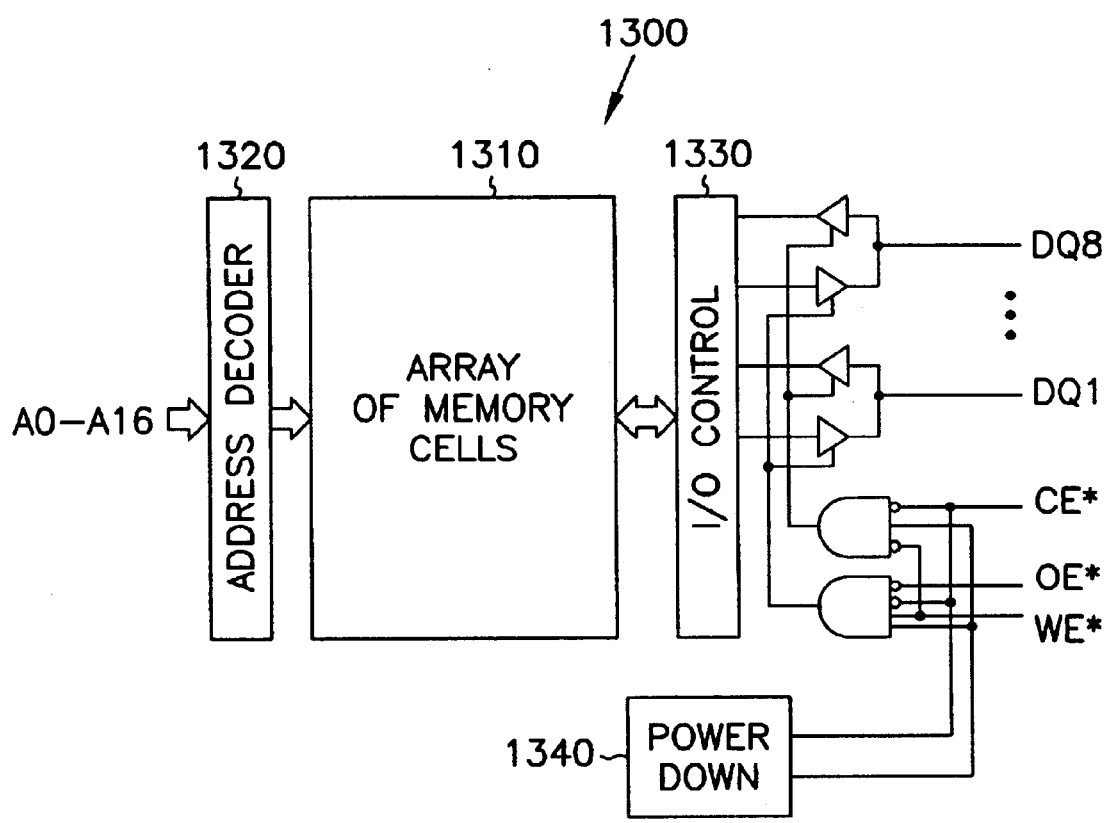
FIG. 13 is a block diagram of a static random access memory device according to an embodiment of the present invention.

A block diagram of a static random access memory device (SRAM) 1300 is shown in FIG. 13 according to an embodiment of the present invention. The SRAM 1300 may include one or more of the circuits and devices described above with respect to FIGS. 1–12 according to embodiments of the present invention. The SRAM 1300 has an array 1310 of memory cells that are accessed according to address signals provided to the SRAM 1300 at a number of address inputs A0–A16. An address decoder 1320 decodes the address signals and accesses memory cells in the array 1310 according to the address signals. Data is written to the memory cells in the array 1310 when a write enable signal WE* and a chip enable signal CE* coupled to the SRAM 1300 are both low. The data is received by the SRAM 1300 over eight data input/output (I/O) paths DQ1–DQ8. The data is coupled to the memory cells in the array 1310 from the I/O paths DQ1–DQ8 through an I/O control circuit 1330. Data is read from the memory cells in the array 1310 when the write enable signal WE* is high and an output enable signal OE* coupled to the SRAM 1300 and the chip enable signal CE* are both low. A power down circuit 1340 controls the SRAM 1300 during a power-down mode. The circuits and devices described above with respect to FIGS. 1–12 according to embodiments of the present invention may be included in other types of memory devices such as DRAMs, programmable logic devices, PROMs, EPROMs, and EEPROMs.

Figure 14:
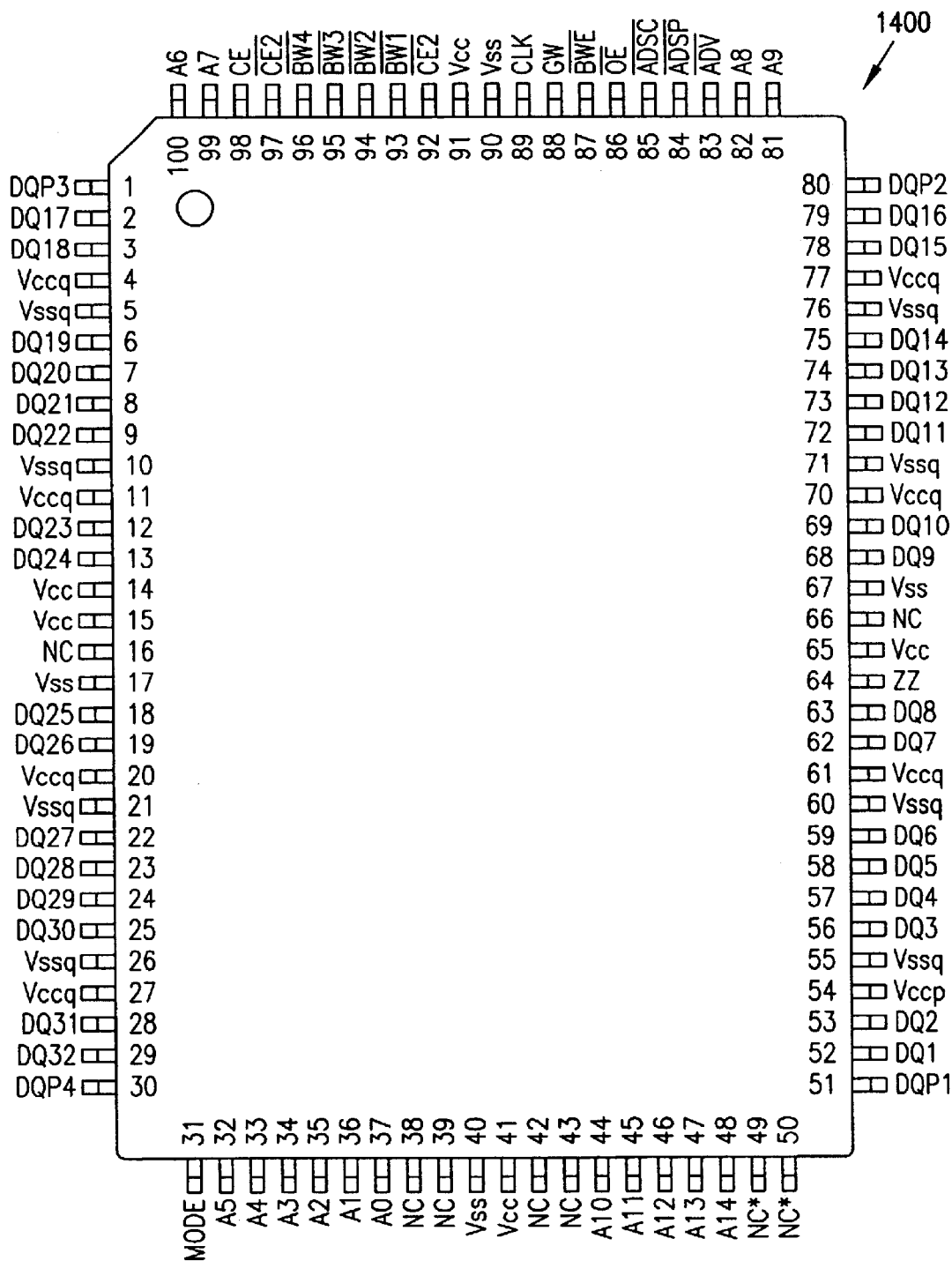
FIG. 14 is an electrical schematic diagram of an integrated circuit package according to an embodiment of the present invention.

An integrated circuit package 1400 of a 32 k×36 SRAM memory device is shown in FIG. 14 according to an embodiment of the present invention. The SRAM includes one or more of the circuits and devices described above with respect to FIGS. 1–13 according to embodiments of the present invention. One of the external pins 220 or 522 described above is one of several pins 16, 38, 39, 42, 43, or 66 in the package 1400. The pins 16, 38, 39, 42, 43, or 66 are non-reserved pins, one of which is used as one of the external pins 220 or 522. The pin selected as one of the external pins 220 or 522 will be coupled to an elevated voltage if an antifuse in the SRAM is to be programmed. The selected pin may be left floating, or may be coupled to the read voltage VREAD during a normal operation of the SRAM.

Figure 15:
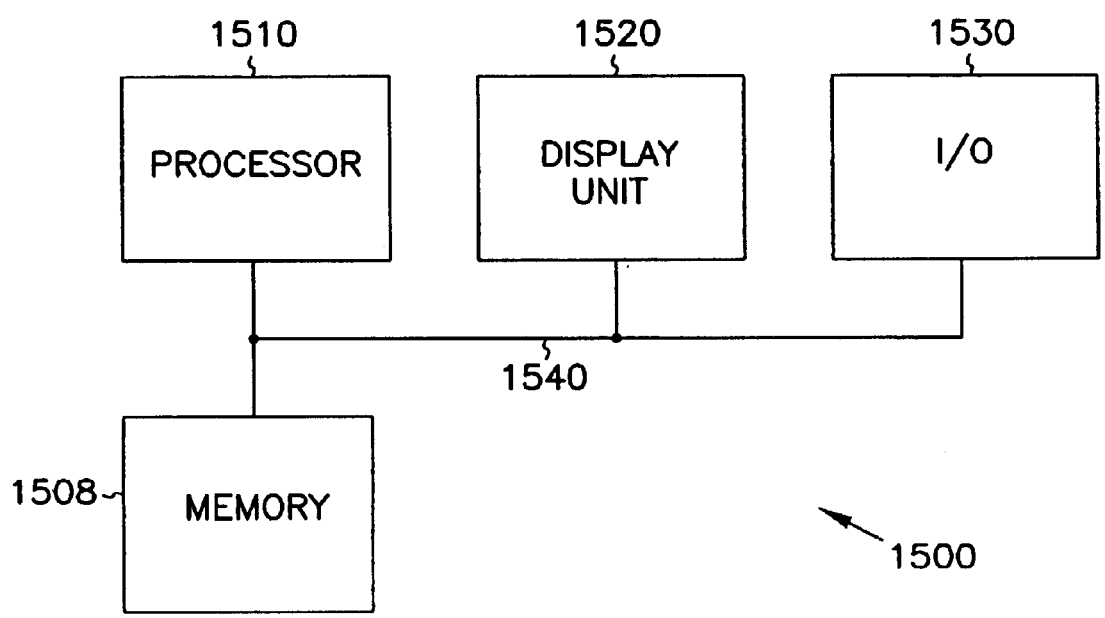
FIG. 15 is a block diagram of an information-handling system according to an embodiment of the present invention.

A block diagram of an information-handling system 1500 is shown in FIG. 15 according to an embodiment of the present invention. The information-handling system 1500 includes a memory system 1508, a processor 1510, a display unit 1520, and an input/output (I/O) subsystem 1530. The processor 1510 may be, for example, a microprocessor. One or more of the memory system 1508, the processor 1510, the display unit 1520, and the 1/0 subsystem 1530 may include one or more of the circuits and devices described above with respect to FIGS. 1–14 according to embodiments of the present invention. The processor 1510, the display unit 1520, the I/O subsystem 1530, and the memory system 1508 are coupled together by a suitable communication line or bus 1540 over which signals are exchanged between them.

Although specific embodiments have been illustrated and described herein, it will be appreciated by those skilled in the art having the benefit of this description that any equivalent arrangement may be substituted for the specific embodiments shown. For example, specific memory devices have been described and shown in the Figures. One skilled in the art having the benefit of this description will recognize that the embodiments of the present invention may be employed in other types of memory devices and in other types of integrated circuit devices. The voltage Vbb described above may be approximately equal to Vss, or may be negative. In addition, in alternate embodiments of the present invention, the common bus line is sized to provide a programming current for more than one antifuse at the same time. The present invention is therefore limited only by the claims and equivalents thereof.

What is claimed is:

1. A method of operating an antifuse circuit comprising:

coupling an elevated voltage to a first terminal of an antifuse in an antifuse circuit, the antifuse comprising a layer of gate dielectric between the first terminal and a second terminal;

controlling current in the antifuse with a program driver circuit coupled to the second terminal of the antifuse; and shunting current around the antifuse with a bypass circuit coupled between the first terminal of the antifuse and the program driver circuit to protect the antifuse.

2. The method of claim 1 wherein:

coupling an elevated voltage further comprises coupling the elevated voltage to a gate electrode of the antifuse through a common bus line during a programming mode of operation, the antifuse comprising a layer of oxide between the gate electrode and a well in a substrate; and shunting current around the antifuse further comprises shunting current around the antifuse with a plurality of p-channel transistors coupled as diodes in series between the gate electrode and the well.

3. The method of claim 2, further comprising:

coupling a supply voltage to the common bus line during an active mode of operation and reading the antifuse with a read circuit coupled to the program driver circuit;

coupling an intermediate voltage between the elevated voltage and the supply voltage to a gate terminal of a high-voltage transistor in the program driver circuit from a gate bias circuit to protect the high-voltage transistor during the programming mode, the high-voltage transistor being coupled to the well; and controlling current flowing through the antifuse and the high-voltage transistor with an n-channel transistor coupled to the high-voltage transistor in the program driver circuit during the programming mode to program the antifuse.

4. The method of claim 1, further comprising:

coupling a supply voltage to a common bus line coupled to the first terminal of the antifuse during an active mode of operation and reading the antifuse with a read circuit coupled to the program driver circuit;

coupling an intermediate voltage between the elevated voltage and the supply voltage to a gate terminal of a high-voltage transistor in the program driver circuit from a gate bias circuit to protect the high-voltage transistor during a programming mode of operation, the high-voltage transistor being coupled to the second terminal of the antifuse;

controlling current flowing through the antifuse and the high-voltage transistor with an n-channel transistor coupled to the high-voltage transistor in the program driver circuit during the programming mode to program the antifuse;

generating an analog voltage in the bypass circuit comprising a first impedance coupled between the first terminal of the antifuse and a second impedance, the second impedance being coupled between the first impedance and a supply voltage; and wherein coupling an elevated voltage further comprises coupling the elevated voltage to a gate electrode of the antifuse through the common bus line during the programming mode, the antifuse comprising a layer of oxide between the gate electrode and a well in a substrate; and wherein shunting current around the antifuse further comprises coupling current from a node between the first impedance and the second impedance in the bypass circuit to the program driver circuit between the high-voltage transistor and the n-channel transistor.

5. A method of operating an antifuse circuit comprising:

coupling an elevated voltage to a first terminal of an antifuse in an antifuse circuit, the antifuse comprising a layer of gate dielectric between the first terminal and a second terminal;

controlling current in the antifuse with a program driver circuit coupled to the second terminal of the antifuse; and shunting current around the antifuse with a plurality of diodes coupled in series between the first terminal of the antifuse and the program driver circuit to protect the antifuse.

6. The method of claim 5 wherein:

coupling an elevated voltage further comprises coupling the elevated voltage to a gate electrode of the antifuse through a common bus line during a programming mode of operation, the antifuse comprising a layer of oxide between the gate electrode and a well in a substrate; and shunting current around the antifuse further comprises shunting current around the antifuse with a plurality of p-channel transistors coupled as diodes in series between the gate electrode and the well.

7. The method of claim 6, further comprising:

coupling a supply voltage to the common bus line during an active mode of operation and reading the antifuse with a read circuit coupled to the program driver circuit;

coupling an intermediate voltage between the elevated voltage and the supply voltage to a gate terminal of a high-voltage transistor in the program driver circuit from a gate bias circuit to protect the high-voltage transistor during the programming mode, the high-voltage transistor being coupled to the well; and controlling current flowing through the antifuse and the high-voltage transistor with an n-channel transistor coupled to the high-voltage transistor in the program driver circuit during the programming mode to program the antifuse.

8. A method of operating an antifuse circuit comprising:

coupling an elevated voltage to a first terminal of an antifuse in an antifuse circuit, the antifuse comprising a layer of gate dielectric between the first terminal and a second terminal;

controlling current in the antifuse with a program driver circuit coupled to the second terminal of the antifuse;

generating an analog voltage in a pre-charge circuit coupled to the first terminal of the antifuse; and coupling current from the pre-charge circuit to the program driver circuit to shunt current around the antifuse to protect the antifuse.

9. The method of claim 8, further comprising:

coupling a supply voltage to a common bus line coupled to the first terminal of the antifuse during an active mode of operation and reading the antifuse with a read circuit coupled to the program driver circuit; and controlling current flowing through the antifuse and the high-voltage transistor with an n-channel transistor coupled to the high-voltage transistor in the program driver circuit during the programming mode to program the antifuse.

10. The method of claim 9, further comprising coupling an intermediate voltage between the elevated voltage and the supply voltage to a gate terminal of a high-voltage transistor in the program driver circuit from a gate bias circuit to protect the high-voltage transistor during a programming mode of operation, the high-voltage transistor being coupled to the second terminal of the antifuse.

11. The method of claim 9 wherein:

generating an analog voltage further comprises generating the analog voltage in the pre-charge circuit comprising a first impedance coupled between the first terminal of the antifuse and a second impedance, the second impedance being coupled between the first impedance and the supply voltage;

coupling an elevated voltage further comprises coupling the elevated voltage to a gate electrode of the antifuse through the common bus line during the programming mode, the antifuse comprising a layer of oxide between the gate electrode and a well in a substrate; and coupling current from the pre-charge circuit further comprises coupling current from a node between the first impedance and the second impedance in the pre-charge circuit to the program driver circuit between the high-voltage transistor and the n-channel transistor.

12. An antifuse circuit comprising:

an antifuse comprising a layer of gate dielectric between a first terminal coupled to receive an elevated voltage and a second terminal in an antifuse circuit;

a program driver circuit coupled to the second terminal of the antifuse to control current in the antifuse; and a bypass circuit coupled between the first terminal of the antifuse and the program driver circuit to shunt current around the antifuse during a programming mode to protect the antifuse.

13. The antifuse circuit of claim 12 wherein:

the antifuse further comprises a layer of oxide between a gate electrode that is coupled to a common bus line in the antifuse circuit and a well in a substrate, the common bus line being coupled to receive the elevated voltage during a programming mode of operation and a supply voltage during an active mode of operation;

the bypass circuit comprises a plurality of p-channel transistors coupled as diodes in series between the gate electrode and the well;

the program driver circuit comprises:
a high-voltage transistor coupled to the well; and
an n-channel transistor coupled to the high-voltage transistor to control current flowing through the antifuse and the high-voltage transistor to program the antifuse during the programming mode.

14. The antifuse circuit of claim 13, further comprising:

a read circuit coupled to the high-voltage transistor to read the antifuse during the active mode; and a gate bias circuit coupled between the common bus line and a gate terminal of the high-voltage transistor to couple an intermediate voltage between the elevated voltage and the supply voltage to the gate terminal of the high-voltage transistor during the programming mode to protect the high-voltage transistor.

15. The antifuse circuit of claim 12 wherein:

the antifuse further comprises a layer of oxide between a gate electrode that is coupled to a common bus line in the antifuse circuit and a well in a substrate, the common bus line being coupled to receive the elevated voltage during a programming mode of operation and a supply voltage during an active mode of operation;

the program driver circuit comprises:
a high-voltage transistor coupled to the well; and
an n-channel transistor coupled to the high-voltage transistor to control current flowing through the antifuse and the high-voltage transistor to program the antifuse during the programming mode; and the bypass circuit comprises:
a first impedance coupled between the gate electrode and a second impedance, the second impedance being coupled between the first impedance and a supply voltage; and
a node between the first impedance and the second impedance in the bypass circuit coupled to the program driver circuit between the high-voltage transistor and the n-channel transistor.

16. An antifuse circuit comprising:

an antifuse comprising a layer of gate dielectric between a first terminal coupled to receive an elevated voltage and a second terminal in an antifuse circuit;

a program driver circuit coupled to the second terminal of the antifuse to control current in the antifuse; and a plurality of diodes coupled in series between the first terminal of the antifuse and the program driver circuit to shunt current around the antifuse to protect the antifuse.

17. The antifuse circuit of claim 16 wherein:

the antifuse further comprises a layer of oxide between a gate electrode that is coupled to a common bus line in the antifuse circuit and a well in a substrate, the common bus line being coupled to receive the elevated voltage during a programming mode of operation and a supply voltage during an active mode of operation; and the plurality of diodes comprises a plurality of p-channel transistors coupled as diodes in series between the gate electrode and the well.

18. The antifuse circuit of claim 17 wherein the program driver circuit comprises:

a high-voltage transistor coupled to the well; and an n-channel transistor coupled to the high-voltage transistor to control current flowing through the antifuse and the high-voltage transistor to program the antifuse during the programming mode.

19. The antifuse circuit of claim 18, further comprising:

a read circuit coupled to the high-voltage transistor to read the antifuse during the active mode; and a gate bias circuit coupled between the common bus line and a gate terminal of the high-voltage transistor to couple an intermediate voltage between the elevated voltage and the supply voltage to the gate terminal during the programming mode to protect the high-voltage transistor.

20. An antifuse circuit comprising:

an antifuse comprising a layer of gate dielectric between a first terminal coupled to receive an elevated voltage and a second terminal in an antifuse circuit;

a pre-charge circuit coupled to the first terminal of the antifuse, the pre-charge circuit comprising a first impedance coupled between the first terminal of the antifuse and a second impedance, the second impedance being coupled between the first impedance and a reference voltage; and a program driver circuit coupled to the second terminal of the antifuse to control current in the antifuse, the program driver circuit being coupled to receive current from a node between the first impedance and the second impedance of the pre-charge circuit to shunt the current around the antifuse to protect the antifuse.

21. The antifuse circuit of claim 20 wherein the antifuse further comprises a layer of oxide between a gate electrode that is coupled to a common bus line in the antifuse circuit and a well in a substrate, the common bus line being coupled to receive the elevated voltage during a programming mode of operation and a supply voltage during an active mode of operation.

22. The antifuse circuit of claim 21 wherein the program driver circuit comprises:
a first high-voltage transistor coupled to the well; and
an n-channel transistor coupled to the first high-voltage transistor to control current flowing through the antifuse and the first high-voltage transistor to program the antifuse during the programming mode.

23. The antifuse circuit of claim 22 wherein the pre-charge circuit comprises:
a first adjustable resistor coupled to the common bus line;
a first diode-connected high-voltage transistor coupled to the first adjustable resistor;
a second adjustable resistor coupled between the first diode-connected high-voltage transistor and the supply voltage; and
a pair of diode-connected high-voltage transistors coupled in series between a node and the first high-voltage transistor in the program driver circuit, the node being coupled between the first adjustable resistor and the first diode-connected high-voltage transistor, the pair of diode-connected high-voltage transistors to couple current to the program driver circuit.

24. The antifuse circuit of claim 23, further comprising a transistor coupled between the first diode-connected high-voltage transistor and a voltage reference to couple the voltage reference to the first diode-connected high-voltage transistor during the active mode to draw current from the pre-charge circuit to the voltage reference.

25. The antifuse circuit of claim 22, further comprising:
a read circuit coupled to the first high-voltage transistor to read the antifuse during the active mode; and
a gate bias circuit coupled between the common bus line and a gate terminal of the first high-voltage transistor to couple an intermediate voltage between the elevated voltage and the supply voltage to the gate terminal of the first high-voltage transistor during the programming mode to protect the first high-voltage transistor.

26. A memory device comprising:
an array of memory cells in a memory device;
an address decoder coupled to the array in the memory device to decode address signals to access the memory cells;
a plurality of input/output paths coupled to the array to couple data to the memory cells;
an input/output control circuit coupled to the array in the memory device to control the data based on control signals;

an antifuse comprising a layer of gate dielectric between a first terminal coupled to receive an elevated voltage and a second terminal in an antifuse circuit in the memory device;
a program driver circuit coupled to the second terminal of the antifuse to control current in the antifuse; and
a bypass circuit coupled between the first terminal of the antifuse and the program driver circuit to shunt current around the antifuse during a programming mode to protect the antifuse.

27. The memory device of claim 26 wherein:
the antifuse further comprises a layer of oxide between a gate electrode that is coupled to a common bus line in the antifuse circuit and a well in a substrate, the common bus line being coupled to receive the elevated voltage during a programming mode of operation and a supply voltage during an active mode of operation;
the bypass circuit comprises a plurality of p-channel transistors coupled as diodes in series between the gate electrode and the well;
the program driver circuit comprises:
a high-voltage transistor coupled to the well; and
an n-channel transistor coupled to the high-voltage transistor to control current flowing through the antifuse and the high-voltage transistor to program the antifuse during the programming mode.

28. The memory device of claim 27, further comprising:
a read circuit coupled to the high-voltage transistor to read the antifuse during the active mode; and
a gate bias circuit coupled between the common bus line and a gate terminal of the high-voltage transistor to couple an intermediate voltage between the elevated voltage and the supply voltage to the gate terminal of the high-voltage transistor during the programming mode to protect the high-voltage transistor.

29. The memory device of claim 26 wherein:
the antifuse further comprises a layer of oxide between a gate electrode that is coupled to a common bus line in the antifuse circuit and a well in a substrate, the common bus line being coupled to receive the elevated voltage during a programming mode of operation and a supply voltage during an active mode of operation;
the program driver circuit comprises:
a high-voltage transistor coupled to the well; and
an n-channel transistor coupled to the high-voltage transistor to control current flowing through the antifuse and the high-voltage transistor to program the antifuse during the programming mode; and
the bypass circuit comprises:
a first impedance coupled between the gate electrode and a second impedance, the second impedance being coupled between the first impedance and a supply voltage; and
a node between the first impedance and the second impedance in the bypass circuit coupled to the program driver circuit between the high-voltage transistor and the n-channel transistor.

30. The memory device of claim 26 wherein the memory device comprises a static random access memory device.

31. The memory device of claim 26 wherein:
the input/output control circuit is coupled to receive a write enable signal, an output enable signal, and a chip enable signal to control the data; and
further comprising a power down circuit in the memory device coupled to the array to control the memory device during a power-down mode.

32. A method of operating a memory device comprising:

accessing memory cells in an array of memory cells in a memory device by decoding address signals in an address decoder coupled to the array in the memory device;

coupling data to the memory cells through a plurality of input/output paths coupled to the array;

controlling the data on the input/output paths with an input/output control circuit;

coupling an elevated voltage to a first terminal of an antifuse in an antifuse circuit in the memory device, the antifuse comprising a layer of gate dielectric between the first terminal and a second terminal;

controlling current in the antifuse with a program driver circuit coupled to the second terminal of the antifuse; and shunting current around the antifuse with a bypass circuit coupled between the first terminal of the antifuse and the program driver circuit to protect the antifuse.

33. The method of claim 32 wherein:

coupling an elevated voltage further comprises coupling the elevated voltage to a gate electrode of the antifuse through a common bus line during a programming mode of operation, the antifuse comprising a layer of oxide between the gate electrode and a well in a substrate; and shunting current around the antifuse further comprises shunting current around the antifuse with a plurality of p-channel transistors coupled as diodes in series between the gate electrode and the well.

34. The method of claim 33, further comprising:

coupling a supply voltage to the common bus line during an active mode of operation and reading the antifuse with a read circuit coupled to the program driver circuit;

coupling an intermediate voltage between the elevated voltage and the supply voltage to a gate terminal of a high-voltage transistor in the program driver circuit from a gate bias circuit to protect the high-voltage transistor during the programming mode, the high-voltage transistor being coupled to the well; and controlling current flowing through the antifuse and the high-voltage transistor with an n-channel transistor coupled to the high-voltage transistor in the program driver circuit during the programming mode to program the antifuse.

35. The method of claim 32, further comprising:

coupling a supply voltage to a common bus line coupled to the first terminal of the antifuse during an active mode of operation and reading the antifuse with a read circuit coupled to the program driver circuit;

coupling an intermediate voltage between the elevated voltage and the supply voltage to a gate terminal of a high-voltage transistor in the program driver circuit from a gate bias circuit to protect the high-voltage transistor during a programming mode of operation, the high-voltage transistor being coupled to the second terminal of the antifuse;

controlling current flowing through the antifuse and the high-voltage transistor with an n-channel transistor coupled to the high-voltage transistor in the program driver circuit during the programming mode to program the antifuse;

generating an analog voltage in the bypass circuit comprising a first impedance coupled between the first terminal of the antifuse and a second impedance, the second impedance being coupled between the first impedance and a supply voltage; and wherein coupling an elevated voltage further comprises coupling the elevated voltage to a gate electrode of the antifuse through the common bus line during the programming mode, the antifuse comprising a layer of oxide between the gate electrode and a well in a substrate; and wherein shunting current around the antifuse further comprises coupling current from a node between the first impedance and the second impedance in the bypass circuit to the program driver circuit between the high-voltage transistor and the n-channel transistor.

36. The method of claim 32 wherein accessing memory cells further comprises accessing memory cells in an array of memory cells in a static random access memory device.

37. The method of claim 32 wherein:

controlling the data further comprises controlling the data on the input/output paths in response to a write enable signal, an output enable signal, and a chip enable signal coupled to the input/output control circuit; and further comprising controlling the memory device with a power down circuit in the memory device coupled to the array during a power-down mode.

38. A system comprising:

a processor;

a memory system coupled to the processor;

an antifuse comprising a layer of gate dielectric between a first terminal coupled to receive an elevated voltage and a second terminal in an antifuse circuit in the memory system;

a program driver circuit coupled to the second terminal of the antifuse to control current in the antifuse; and a bypass circuit coupled between the first terminal of the antifuse and the program driver circuit to shunt current around the antifuse during a programming mode to protect the antifuse.

39. The system of claim 38 wherein:

the antifuse further comprises a layer of oxide between a gate electrode that is coupled to a common bus line in the antifuse circuit and a well in a substrate, the common bus line being coupled to receive the elevated voltage during a programming mode of operation and a supply voltage during an active mode of operation;

the bypass circuit comprises a plurality of p-channel transistors coupled as diodes in series between the gate electrode and the well;

the program driver circuit comprises:

a high-voltage transistor coupled to the well; and an n-channel transistor coupled to the high-voltage transistor to control current flowing through the antifuse and the high-voltage transistor to program the antifuse during the programming mode.

40. The system of claim 39, further comprising:

a read circuit coupled to the high-voltage transistor to read the antifuse during the active mode; and a gate bias circuit coupled between the common bus line and a gate terminal of the high-voltage transistor to couple an intermediate voltage between the elevated voltage and the supply voltage to the gate terminal of the high-voltage transistor during the programming mode to protect the high-voltage transistor.

41. The system of claim 38 wherein:

the antifuse further comprises a layer of oxide between a gate electrode that is coupled to a common bus line in the antifuse circuit and a well in a substrate, the common bus line being coupled to receive the elevated voltage during a programming mode of operation and a supply voltage during an active mode of operation;

the program driver circuit comprises:
    a high-voltage transistor coupled to the well; and
    an n-channel transistor coupled to the high-voltage transistor to control current flowing through the antifuse and the high-voltage transistor to program the antifuse during the programming mode; and the bypass circuit comprises:
    a first impedance coupled between the gate electrode and a second impedance, the second impedance being coupled between the first impedance and a supply voltage; and
    a node between the first impedance and the second impedance in the bypass circuit coupled to the program driver circuit between the high-voltage transistor and the n-channel transistor.

42. The system of claim 38, further comprising:
    a display unit;
    an input/output subsystem; and
    a bus coupled to the processor, the memory system, the display unit, and the input/output subsystem.

43. The system of claim 38 wherein the processor comprises a microprocessor.

44. A method of operating a system comprising:
    exchanging signals between a processor and a memory system coupled together;
    coupling an elevated voltage to a first terminal of an antifuse in an antifuse circuit in the memory system, the antifuse comprising a layer of gate dielectric between the first terminal and a second terminal;
    controlling current in the antifuse with a program driver circuit coupled to the second terminal of the antifuse; and
    shunting current around the antifuse with a bypass circuit coupled between the first terminal of the antifuse and the program driver circuit to protect the antifuse.

45. The method of claim 44 wherein:
    coupling an elevated voltage further comprises coupling the elevated voltage to a gate electrode of the antifuse through a common bus line during a programming mode of operation, the antifuse comprising a layer of oxide between the gate electrode and a well in a substrate; and
    shunting current around the antifuse further comprises shunting current around the antifuse with a plurality of p-channel transistors coupled as diodes in series between the gate electrode and the well.

46. The method of claim 45, further comprising:
    coupling a supply voltage to the common bus line during an active mode of operation and reading the antifuse with a read circuit coupled to the program driver circuit;
    coupling an intermediate voltage between the elevated voltage and the supply voltage to a gate terminal of a high-voltage transistor in the program driver circuit from a gate bias circuit to protect the high-voltage transistor during the programming mode, the high-voltage transistor being coupled to the well; and
    controlling current flowing through the antifuse and the high-voltage transistor with an n-channel transistor coupled to the high-voltage transistor in the program driver circuit during the programming mode to program the antifuse.

47. The method of claim 44, further comprising:
    coupling a supply voltage to a common bus line coupled to the first terminal of the antifuse during an active mode of operation and reading the antifuse with a read circuit coupled to the program driver circuit;
    coupling an intermediate voltage between the elevated voltage and the supply voltage to a gate terminal of a high-voltage transistor in the program driver circuit from a gate bias circuit to protect the high-voltage transistor during a programming mode of operation, the high-voltage transistor being coupled to the second terminal of the antifuse;
    controlling current flowing through the antifuse and the high-voltage transistor with an n-channel transistor coupled to the high-voltage transistor in the program driver circuit during the programming mode to program the antifuse;
    generating an analog voltage in the bypass circuit comprising a first impedance coupled between the first terminal of the antifuse and a second impedance, the second impedance being coupled between the first impedance and a supply voltage; and
    wherein coupling an elevated voltage further comprises coupling the elevated voltage to a gate electrode of the antifuse through the common bus line during the programming mode, the antifuse comprising a layer of oxide between the gate electrode and a well in a substrate; and
    wherein shunting current around the antifuse further comprises coupling current from a node between the first impedance and the second impedance in the bypass circuit to the program driver circuit between the high-voltage transistor and the n-channel transistor.

48. The method of claim 44 wherein exchanging signals further comprises exchanging signals between the processor, the memory system, an input/output subsystem, and a display unit over a bus coupled between the processor, the memory system, the input/output subsystem, and the display unit.

49. The method of claim 44 wherein exchanging signals comprises exchanging signals between a microprocessor and a memory system coupled together.

50. An antifuse circuit comprising:
    an antifuse comprising a layer of gate dielectric between a first terminal coupled to a common bus line to receive an elevated voltage and a second terminal in an antifuse circuit;
    a program driver circuit coupled to the second terminal of the antifuse to program the antifuse;
    a read circuit coupled to the program driver circuit to read the antifuse; and
    means for shunting current from the common bus line to the program driver circuit around the antifuse to protect the antifuse.

* * * * *